United States Patent
Ohsawa

(10) Patent No.: US 6,781,875 B2
(45) Date of Patent: Aug. 24, 2004

(54) SEMICONDUCTOR MEMORY DEVICE AND SEMICONDUCTOR DEVICE

(75) Inventor: Takashi Ohsawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/369,660

(22) Filed: Feb. 21, 2003

(65) Prior Publication Data

US 2003/0231521 A1 Dec. 18, 2003

(30) Foreign Application Priority Data

Jun. 18, 2002 (JP) .................................... 2002-177072

(51) Int. Cl.[7] .............................................. G11C 11/34
(52) U.S. Cl. .............. 365/174; 365/185.05; 365/185.26
(58) Field of Search ........................... 365/174, 185.05, 365/185.26, 185.23

(56) References Cited

U.S. PATENT DOCUMENTS 4,264,965 A * 4/1981 Onishi ........................ 365/174
5,963,471 A * 10/1999 Ohata et al. ................. 365/174

OTHER PUBLICATIONS

Takashi Ohsawa, et al. "Memory Design Using One–Transistor Gain Cell On SOI" 2002 IEEE International Solid–State Circuits Conference, 2002, pp. 152–153, and 454.

Don Weiss, et al. "The On–Chip 3MB Subarray Based 3rd Level Cache On An Itanium Microprocessor" ISSCC Digest of Technical Papers, Feb. 4, 2002, 3 pages.

R. Weis, et al. "A Highly Cost Efficient $8F^2$ DRAM Cell With A Double Gate Vertical Transistor Device For 100 NM And Beyond" IEDM Tech. Dig., Dec. 2001, pp. 415–418.

Yongjik Park, et al. "COB Stack DRAM Cell Technology Beyond 100NM Technology Node" IEDM Tech. Dig., Dec. 2001, pp. 391–394.

* cited by examiner

Primary Examiner—Huan Hoang
(74) Attorney, Agent, or Firm—Oblon, Spivak, McClelland, Maier & Neustadt, P.C.

(57) ABSTRACT

A semiconductor memory device includes a memory cell array having a plurality of memory cells, and each of the memory cells includes a first MISFET and a second MISFET. The first MISFET includes a first source region, a first drain region and a first gate electrode, and a semiconductor layer between the first source region and the first drain region is a floating body in a floating state. The second MISFET includes a second source region, a second drain region and a second gate electrode, and the semiconductor layer between the second source region and the second drain region is the floating body shared with the first MISFET.

21 Claims, 21 Drawing Sheets

SEMICONDUCTOR MEMORY DEVICE AND SEMICONDUCTOR DEVICE

CROSS REFERENCE TO RELATED APPLICATION

This application claims benefit of priority under 35 U.S.C. §119 to Japanese Patent Application No. 2002-177072, filed on Jun. 18, 2002, the entire contents of which are incorporated by reference herein.

BACKGROUND OF THE INVENTION

1. Field of the Invention

The present invention relates to a semiconductor memory device and a semiconductor device, and particularly relates to a semiconductor memory device and a semiconductor device which comprise memory cells each of which has two MISFETs sharing a floating body.

2. Description of the Related Art

A first level, a second level, and a third level cache memory are made of an SRAM as a high-speed memory required by a CPU, and recently higher-level ones or all of them are mixedly mounted on the same chip. This is done to eliminate disadvantages caused by distributing data to the outside of the chip, for example, to eliminate an increase in access time, an increase in power, and soon by mixedly mounting them on one chip. These cache memories require, as they go to a higher level, a memory which has smaller capacity and can realize higher-speed access.

Since the first level cache requires such a high speed as only a so-called 6-transistor SRAM can achieve, it is difficult to realize it by memory cells other than this in the present circumstances, but as concerns the second level or third level cache memory, the limitation on access time is less tight than that in the first level cache memory, and hence there is a possibility that it is replaced by a DRAM cell. Especially, the third level cache memory has been increased in capacity as is shown in a recent design example in which 24 Mbits (3M Byte) are formed on a chip (D. Weiss et al., "The On-chip 3 MB Subarray Based 3rd Level Cache on an Itanium Microprocessor", ISSCC Digest of Technical Papers, pp.112–113, February., 2002).

In this example, the ratio of the chip area occupied by the third level cache memory to the chip area of the whole CPU is nearly 50%. Accordingly, when the third level cache memory is mounted on the same chip as the CPU, the cell area is particularly an important factor. Therefore, it is more advantageous in terms of the cell area that the third level cache memory is composed of one transistor-one capacitor (1T-1C) in place of the 6-transistor SRAM.

However, its problem is that the current process of manufacturing the 1T-1C memory cell is greatly different from the process of manufacturing the CPU. This is because the process of manufacturing a capacitor of the 1T-1C memory cell is more complicated than the process of manufacturing the CPU. Hence, if the third level cache memory is composed of 1T-1C, there arises a problem that the manufacturing cost increases.

Especially, in recent fine memory cells, be they of a trench type or a stack type, it is difficult to manufacture their capacitors. In the case of the trench type, there is a tendency to dig a trench for a capacitor with a very large aspect ratio and form a vertical transistor (R. Weis et al. "A Highly Cost Effective $8F^2$ DRAM Cell with a Double Gate Vertical Transistor Device for 100 nm and Beyond", IEDM Tech. Dig., pp.415–418, December 2001). In the case of the stack type, there arises a need for developing an insulating film with a high dielectric constant in place of $SiO_2$ (Y. Park and K. Kim, "COB Stack DRAM Cell Technology beyond 100 nm Technology Node", IEDM Tech. Dig., pp.391–394, December 2001). Thus, the manufacturing process of memory cells of the DRAM becomes remoter from the manufacturing process of a logic circuit such as the CPU. Accordingly, the formation of a DRAM cell with a relatively small memory cell area as a cache memory on a chip with a CPU without a large increase in manufacturing cost can not be realized by the current technology.

SUMMARY OF THE INVENTION

In order to accomplish the aforementioned and other objects, according to one aspect of the present invention, a semiconductor memory device includes a memory cell array having a plurality of memory cells, and each of the memory cells comprises:

a first MISFET including a first source region formed in a semiconductor layer, a first drain region which is formed in the semiconductor layer and which is apart from the first source region, and a first gate electrode formed on the semiconductor layer between the first source region and the first drain region, wherein the semiconductor layer between the first source region and the first drain region is a floating body in a floating state; and a second MISFET including a second source region formed in the semiconductor layer, a second drain region which is formed in the semiconductor layer and which is apart from the second source region, and a second gate electrode formed on the semiconductor layer between the second source region and the second drain region, wherein the semiconductor layer between the second source region and the second drain region is the floating body shared with the first MISFET.

According to another aspect of the present invention, a semiconductor device comprises:

a semiconductor memory which is formed on a semiconductor chip; and a logic circuit which is formed on the semiconductor chip and which operates using the semiconductor memory cell, wherein the semiconductor memory includes a memory cell array having a plurality of memory cells, each of the memory cells comprises:

a first MISFET including a first source region formed in a semiconductor layer, a first drain region which is formed in the semiconductor layer and which is apart from the first source region, and a first gate electrode formed on the semiconductor layer between the first source region and the first drain region, wherein the semiconductor layer between the first source region and the first drain region is a floating body in a floating state; and a second MISFET including a second source region formed in the semiconductor layer, a second drain region which is formed in the semiconductor layer and which is apart from the second source region, and a second gate electrode formed on the semiconductor layer between the second source region and the second drain region, wherein the semiconductor layer between the second source region and the second drain region is the floating body shared with the first MISFET.

DETAILED DESCRIPTION OF THE INVENTION

[First Embodiment]

The first embodiment is designed in such a manner that each of memory cells which constitute a memory cell array includes a first MISFET and a second MISFET sharing a floating body, so that this memory cell can be accessed from both the first MISFET and the second MISFET. Moreover, by connecting a gate and a drain of the first MISFET in each of the memory cells to a normal word line and a normal bit line respectively and connecting a gate and a drain of the second MISFET to a refresh word line and a refresh bit line respectively, a refresh operation for this memory cell array can be concealed from the outside of the memory device. Further details will be explained below.

Figure 1:
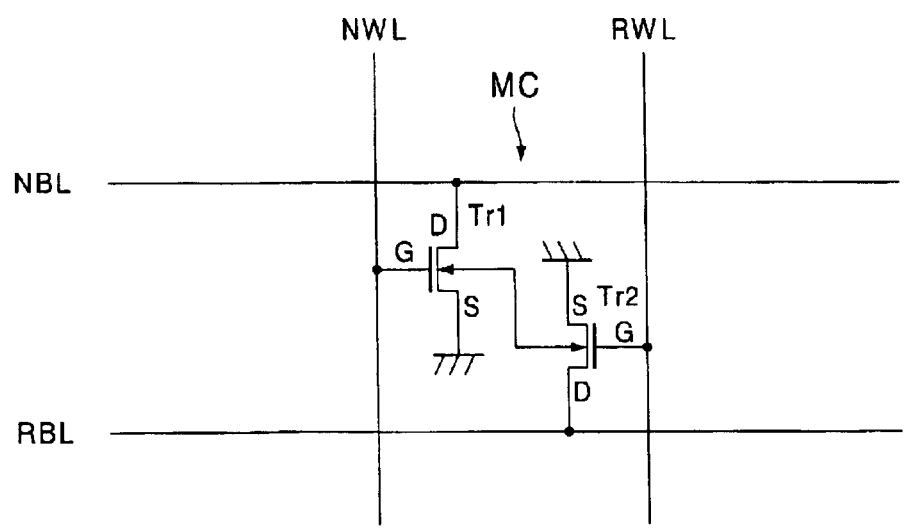
FIG. 1 is a circuit diagram showing a connection relationship of a memory cell according to a first embodiment.

FIG. 1 shows a circuit diagram of a memory cell MC according to this embodiment. As shown in FIG. 1, in this embodiment, one unit memory cell MC includes two MISFETs Tr1 and Tr2. A floating body of the MISFET Tr1 and a floating body of the MISFET Tr2 are connected in common and store one bit of information by the two MISFETs.

A gate G of the MISFET Tr1 is connected to a normal word line NWL, a drain D thereof is connected to a normal bit line NBL, and a source S thereof is connected to a ground (GND) via a common source line. On the other hand, the gate G of the MISFET Tr2 is connected to a refresh word line RWL, the drain D thereof is connected to a refresh bit line RBL, and the source S thereof is connected to the ground via the common source line.

The memory cell MC in FIG. 1 is accessible from both the MISFET Tr1 and the MISFET Tr2, and can perform data read and data write. In this embodiment, however, simultaneous access from the MISFET Tr1 and the MISFET Tr2 is not performed.

Figure 2:
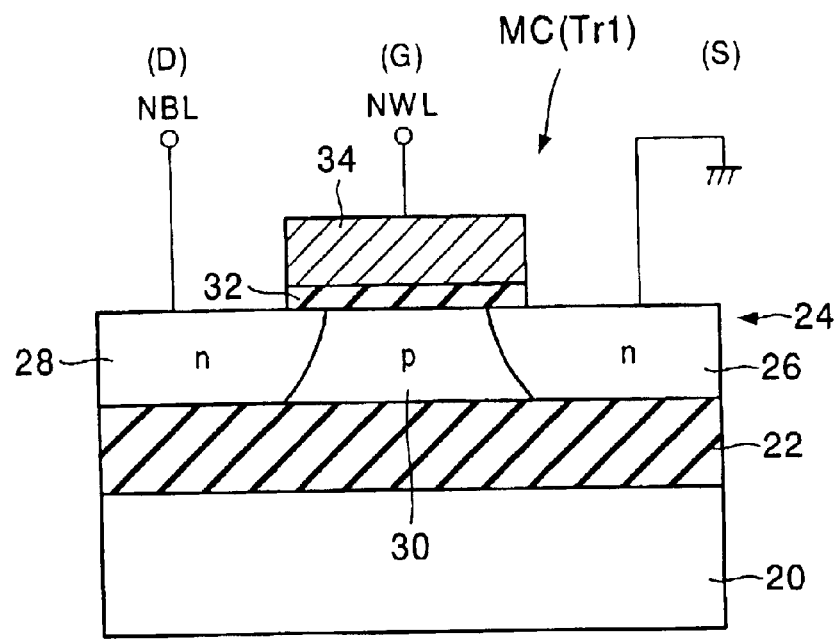
FIG. 2 is a sectional view of a semiconductor for explaining the structure of a first MISFET in the memory cell according to the first embodiment.
Figure 3:
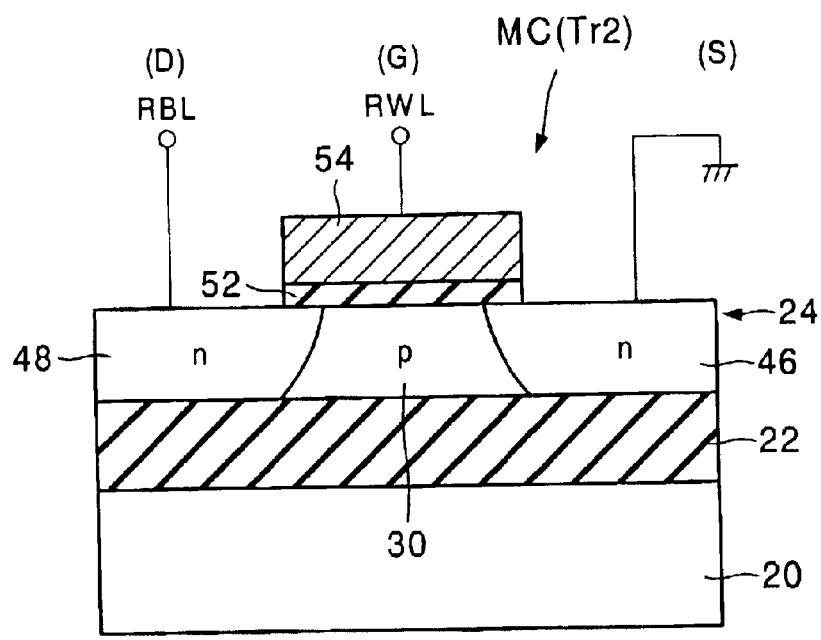
FIG. 3 is a sectional view of the semiconductor for explaining the structure of a second MISFET in the memory cell according to the first embodiment.

FIG. 2 is a sectional view explaining the structure of the MISFET Tr1, and FIG. 3 is a sectional view explaining the structure of the MISFET Tr2.

As shown in FIG. 2, in the memory cell MC according to this embodiment, an insulating film 22 is formed on a semiconductor substrate 20, for example, formed out of silicon. In this embodiment, this insulating film 22 is formed by a silicon oxide film, for example, but may be formed by other kinds of insulating films.

A p-type semiconductor layer 24 is formed on the insulating film 22. Namely, the MISFET Tr1 of the memory cell MC in this embodiment is formed on an SOI (silicon on insulator) substrate. An n-type source region 26 and an n-type drain region 28 are formed in the semiconductor layer 24. These source region 26 and drain region 28 are formed apart from each other and formed deep enough to reach the insulating film 22. The semiconductor layer 24 between these source region 26 and drain region 28 forms a floating body 30. A gate electrode 34 is formed on the floating body 30 between the source region 26 and the drain region 28 with a gate insulating film 32 therebetween. Although this gate insulating film 32 is formed, for example, by a silicon oxide film in this embodiment, it may be formed by other kinds of insulating films.

As stated above, the source region 26 of the MISFET Tr1 is connected to the common source line, the drain region 28 thereof is connected to the normal bit line NBL, and the gate electrode 34 thereof is connected to the normal word line NWL.

Similarly, as shown in FIG. 3, the MISFET Tr2 is also formed on the SOI substrate having the common semiconductor substrate 20 and insulating film 22. The semiconductor layer 24 shared with the MISFET Tr1 is formed on the insulating film 22. An n-type source region 46 and an n-type drain region 48 for the MISFET Tr2 are formed in the semiconductor layer 24. These source region 46 and drain region 48 are formed apart from each other and formed deep enough to reach the insulating film 22. Moreover, these source region 46 and drain region 48 are formed apart from the source region 26 and the drain region 28 of the MISFET Tr1. The semiconductor layer 24 between these source region 46 and drain region 48 forms the floating body 30. This floating body 30 is shared with the MISFET Tr1. A gate electrode 54 is formed on the floating body 30 between the source region 46 and the drain region 48 with a gate insulating film 52 therebetween. Although this gate insulating film 32 is formed, for example, by a silicon oxide film in this embodiment, it may be formed by other kinds of insulating films.

An insulation region (not shown) to insulate the floating body 30 from other memory cells is formed around the floating body 30. Therefore, this floating body 30 is electrically insulated from other memory cells MC by the source regions 26 and 46, the drain regions 28 and 48, the insulating film 22, and the insulation region, and brought into a floating state.

As stated above, the source region 46 of the MISFET Tr2 is connected to the common source line, the drain region 48 thereof is connected to the refresh bit line RBL, and the gate electrode 54 thereof is connected to the refresh word line RWL.

The memory cell MC shown in FIG. 1 to FIG. 3 dynamically stores a first data state in which the floating body 30 is set at a first voltage and a second data state in which it is set at a second voltage. More specifically, the first data state is written by applying a high-level voltage to the normal word line NWL and the normal bit line NBL to allow the memory cell MC to perform a pentode operation and thereby causing impact ionization near its drain junction to generate majority carriers (holes in the case of an n-channel) and holding them in the floating body 30. This is, for example, data "1". Also by applying a high-level voltage to the refresh word line RWL and the refresh bit line RBL, the same operation is performed, whereby the data "1" can be written.

The second data state is written by applying a high-level voltage to the normal word line NWL to raise the voltage of the floating body 30 by capacitive coupling, setting the normal bit line NBL at a low-level voltage, and passing a forward bias current through a junction between the floating body 30 and the drain region 28 of the selected memory cell MC to emit majority carriers in the floating body 30 to the drain region 28. This is, for example, data "0". Also by applying a high-level voltage to the refresh word line RWL to raise the voltage of the floating body 30 by capacitive coupling and setting the refresh bit line RBL at a low-level voltage, the same operation is performed, whereby the data "0" can be written.

In other words, the number of the majority carriers accumulated in the floating body 30 in the first data state is more than the number of the majority carriers accumulated in the floating body 30 in the second state, in this embodiment.

Whether the memory cell MC holds the data "1" or the data "0" is shown by a difference in MISFET gate threshold voltage. Namely, the relation between a floating body voltage VB and a gate voltage VG of the memory cell MC holding the data "1" and the relation between the floating body voltage VB and the gate voltage VG of the memory cell MC holding the data "0" are shown by a graph in FIG. 4.

Figure 4:
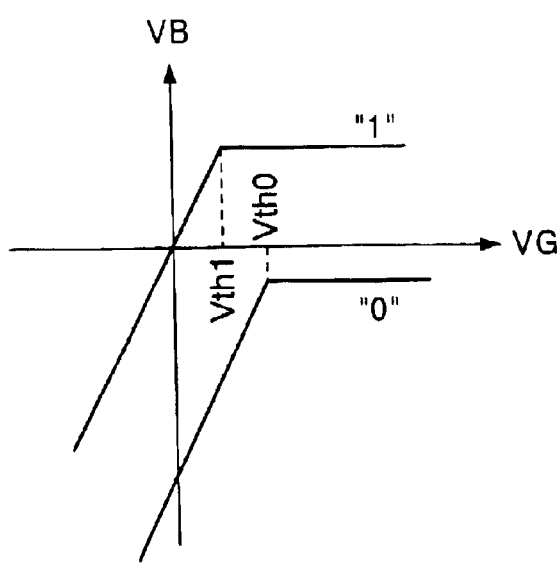
FIG. 4 is a graph for explaining a change in the threshold voltage of the memory cell by the use of the relation between gate voltage and floating body voltage.

As shown in FIG. 4, as the result of a body effect by the floating body voltage VB, a threshold voltage Vth1 of the memory cell MC holding the data "1" becomes lower than a threshold voltage Vth0 of the memory cell MC holding the data "0". Accordingly, data read from the memory cell MC can be determined by sensing a difference in cell current due to a difference in threshold voltage. As just described, the cell current flowing through the memory cell MC can be sensed by the MISFET Tr1, and also by the MISFET Tr2.

Incidentally, in this embodiment, the MISFET Tr1 and the MISFET Tr2 are not accessed simultaneously as stated above, and hence the normal word line NWL and the refresh word line RWL are not simultaneously activated and do not go high in one memory cell MC. Namely, at least one of the normal word line NWL and the refresh word line RWL is held at a negative voltage level in this embodiment.

Therefore, holes are accumulated in the floating body 30, and an appropriate capacitance is formed between the normal word line NWL and the floating body 30 or between the refresh word line RWL and the floating body 30, and this capacitance functions as a stabilizing capacitor. Hitherto, the stabilizing capacitor is (1) formed as a capacitance between a polysilicon pillar formed in an STI (shallow trench isolation) and the floating body, (2) formed as a capacitance between a back gate buried in the insulating film 22 and the floating body 30, or (3) formed as a gate capacitance of a different MISFET by providing the different MISFET from the MISFETs Tr1 and Tr2. According to this embodiment, however, it becomes possible to omit this stabilizing capacitor which is required for a related FBC.

Figure 5:
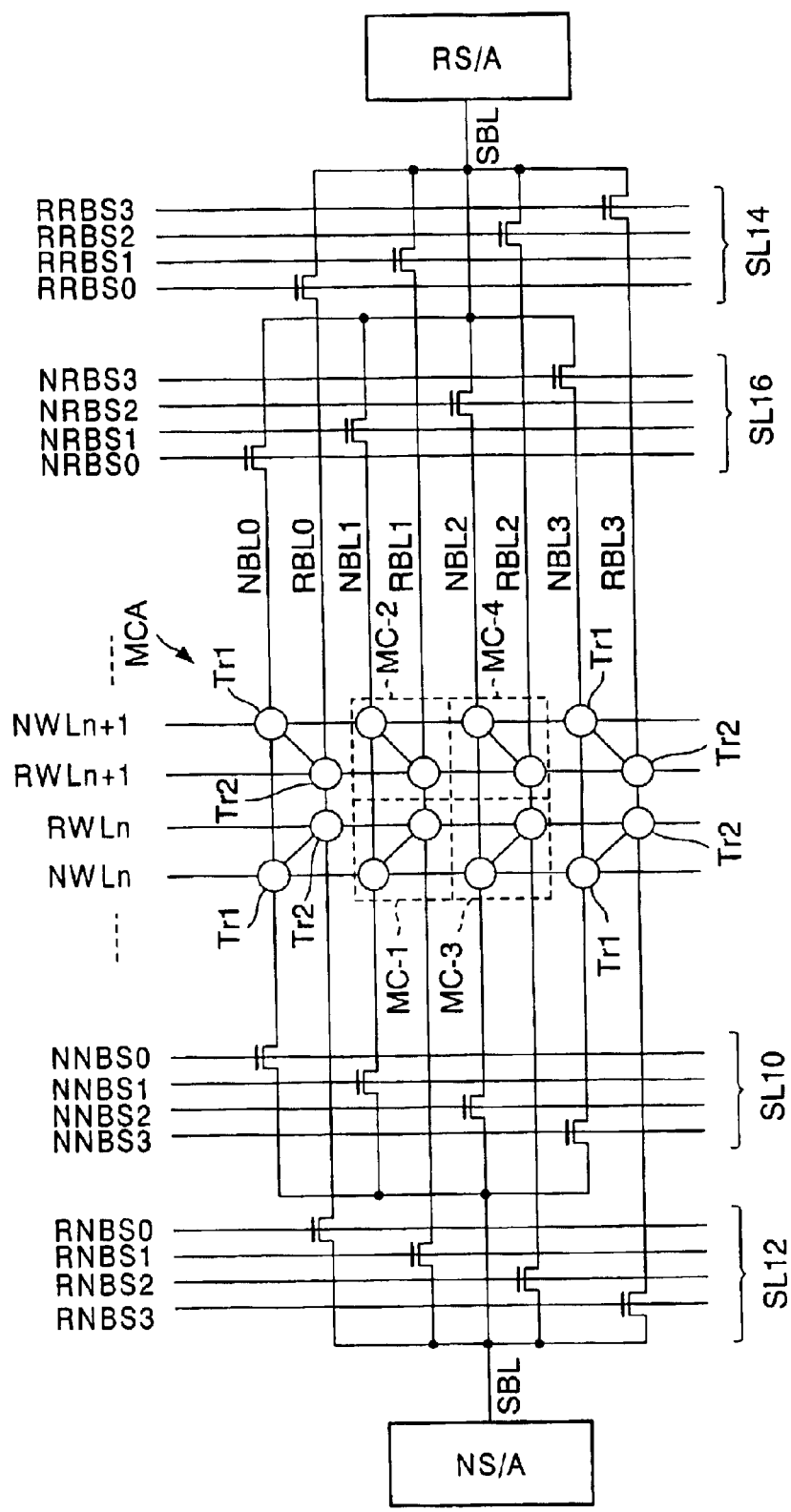
FIG. 5 is a diagram explaining the connection relationship of a memory cell array and the arrangement of sense amplifier circuits according to the first embodiment.

FIG. 5 is a diagram showing the configurations of a memory cell array MCA in which the memory cells MC are arranged in a matrix form and bit line selecting circuits SL10 to SL16, and the arrangement of sense amplifier circuits. In FIG. 5, each of circle marks represents the MISFET Tr1 or the MISFET Tr2, and one memory cell MC sharing the floating body 30 is composed of two MISFETs connected by a line.

In a row direction of the memory cell array MCA, normal bit lines NBL0 to NBL3 and refresh bit lines RBL0 to RBL3 are alternately formed in parallel. To be precise, drains of the MISFETs Tr1 arranged in the same row are connected to one of the normal bit lines NBL0 to NBL3, and drains of the MISFETs Tr2 arranged in the same row are connected to one of the refresh bit lines RBL0 to RBL3.

In a column direction of the memory cell array MCA, two normal word lines NWLn and two refresh word lines RWLn are alternately formed in parallel. To be precise, gates of the MISFETs Tr1 arranged in the same column are connected to one of the normal word line NWLn, and gates of the MISFETs Tr2 arranged in the same column are connected to one of the refresh word line RWLn.

Incidentally, although eight memory cells MC are shown in the memory cell array MCA in FIG. 5, in actuality, more memory cells MC in the row and column directions are arranged in a matrix form. 256 normal word lines NWLn and 256 refresh word lines RWLn are provided here. Namely, n=0 to 255.

A first bit line selecting circuit SL10 and a second bit line selecting circuit SL12 are provided on the left side of the memory cell array MCA in FIG. 5, and a third bit line selecting circuit SL14 and a fourth bit line selecting circuit SL16 are provided on the right side of the memory cell array MCA in FIG. 5. The first bit line selecting circuit SL10 connects any one of the normal bit lines NBL0 to NBL3 to a normal sense amplifier circuit NS/A based on selection signals of first selection signal lines NNBS0 to NNBS3. The second bit line selecting circuit SL12 connects any one of the refresh bit lines RBL0 to RBL3 to the normal sense amplifier circuit NS/A based on selection signals of second selection signal lines RNBS0 to RNBS3.

The third bit line selecting circuit SL14 connects any one of the refresh bit lines RBL0 to RBL3 to a refresh sense amplifier circuit RS/A based on selection signals of third selection signal lines RRBS0 to RRBS3. The fourth bit line selecting circuit SL16 connects any one of the normal bit lines NBL0 to NBL3 to the refresh sense amplifier circuit RS/A based on selection signals of fourth selection signal lines NRBS0 to NRBS3.

Next, based on FIG. 5, a method of controlling a normal operation and a refresh operation performed for the memory cell array MCA in a semiconductor memory device according to this embodiment will be explained. The meaning of the normal operation includes a read operation and a write operation. In this embodiment, by classifying an operation pattern into the following seven cases, the refresh operation can be performed in the background.

First, it is premised that also in the normal operation, all the sense amplifier circuits NS/A provided along an activated normal word line NWL are operated to perform the operation of reading and latching data in the memory cell selected by the bit line selecting circuit and write it back to the memory cell MC. When the normal operation is the read operation, the latched data is read. When the normal operation is the write operation, the latched data is inverted and written as required. In other words, when the read data matches data to be written, the latched data is written back as it is, and when the read data and the data to be written do not match, the latched data is inverted and written.

(1) A case where only the normal operation is requested of the memory cell array MCA One selected normal word line NWLi (i=0 to 255) is activated and goes high, and one normal bit line NBL selected by the first bit line selecting circuit SL10 is connected to the normal sense amplifier circuit NS/A. Namely, any one of the selection signals of the first selection signal lines NNBS0 to NNBS3 is activated and goes high, and any one of the normal bit lines NBL0 to NBL3 is connected to the normal sense amplifier circuit NS/A. In the normal sense amplifier circuit NS/A, data in the selected memory cell MC is read and latched by using the MISFET Tr1. If the normal operation is the read operation, this latched data is outputted as read data, and if the normal operation is the write operation, this latched data is written as it is into the memory cell MC or this latched data is inverted and written into the memory cell MC according to data to be written.

(2) A case where only the refresh operation is requested of the memory cell array MCA One selected refresh word line RWLi (i=0 to 255) is activated and goes high, and one refresh bit line RBL selected by the third bit line selecting circuit SL14 is connected to the refresh sense amplifier circuit RS/A. Namely, any one of the selection signals of the third selection signal lines RRBS0 to RRBS3 is activated and goes high, and any one of the refresh bit lines RBL0 to RBL3 is connected to the refresh sense amplifier circuit RS/A. In the refresh sense amplifier circuit RS/A, data in the selected memory cell MC is read and written again into the memory cell MC by using the MISFET Tr2.

(3) A case where the normal operation and the refresh operation are concurrently requested of the memory cell array MCA, but their word line selection addresses are different This is a case where, for example, in FIG. 5, while the normal operation is being performed for a memory cell MC-1, a request for the refresh operation is made to a memory cell MC-2 or a memory cell MC-4. In this case, the normal word line NWL activated in the normal operation and the refresh word line RWL activated in the refresh operation belong to different word line selection addresses, and hence, it is suitable that the aforementioned operation in (1) and operation in (2) be performed independently.

(4) A case where the refresh operation is requested of the memory cell MC which is performing the normal operation This is a case where, for example, in FIG. 5, while the normal operation is being performed for the memory cell MC-1, a request for the refresh operation is made to the same memory cell MC-1. In this case, the normal operation is performed in accordance with the aforementioned (1). From the aforementioned premise, write back to the memory cell MC is performed in the read operation for this memory cell MC, or write into the memory cell MC is performed in the write operation for this memory cell MC. Accordingly, the refresh operation for this memory cell MC is unnecessary. Therefore, the refresh operation for this memory cell MC is not performed, and a counter for refresh control (internal row address counter in this case) is incremented by one. Since the refresh operation is not performed, the refresh word line RWL is not activated, and the refresh sense amplifier circuit RS/A is not activated, either.

(5) A case where the normal operation is requested of the memory cell MC which is performing the refresh operation This is a case where, for example, in FIG. 5, while the refresh operation is being performed for the memory cell MC-1, a request for the normal operation is made to the same memory cell MC-1. In this case, the refresh operation is performed in accordance with the aforementioned (2). Thus, an I/O port is switched so that the normal operation is performed via the refresh sense amplifier circuit RS/A. Therefore, the normal word line NWL is not activated, and the normal sense amplifier circuit NS/A is not activated, either. When the normal operation is the read operation, data latched by the refresh sense amplifier circuit RS/A is read. When the normal operation is the write operation, the data latched by the refresh sense amplifier circuit RS/A is written as it is into the memory cell MC or the data latched by the refresh sense amplifier circuit RS/A is inverted and written depending on data to be written.

(6) A case where while the normal operation is being performed, the refresh operation is requested of the memory cell MC which is not the memory cell MC performing the normal operation but has the same word line selection address This is a case where, for example, in FIG. 5, while the normal operation is being performed for the memory cell MC-1, a request for the refresh operation is made to a memory cell MC-3. In this case, the normal operation is performed in accordance with the aforementioned (1). Thus, in the refresh operation, the normal bit line NBL2 is selected and connected to the refresh sense amplifier circuit RS/A by the fourth bit line selecting circuit SL16. The refresh sense amplifier circuit RS/A then reads data in the memory cell MC-3 and writes it again by using the MISFET Tr1. The refresh word line RWL is not activated.

Namely, in the case of (6), there is the possibility that when both the normal word line NWL for performing the normal operation and the refresh word line RWL for performing the refresh operation are activated and go high, both the gate of the MISFET Tr1 and the gate of the MISFET Tr2 in the memory cell MC go high, and thereby held data is destroyed. Therefore, by using the normal word line NWL which is already activated in the normal operation, data for refresh is read and written back.

(7) A case where while the refresh operation is being performed, the normal operation is requested of the memory cell MC which is not the memory cell MC performing the refresh operation but has the same word line selection address This is a case where, for example, in FIG. 5, while the refresh operation is being performed for the memory cell MC-1, a request for the normal operation is made to the memory cell MC-3. In this case, the refresh operation is performed in accordance with the aforementioned (2). Thus, in the normal operation, the refresh bit line RBL2 is selected and connected to the normal sense amplifier circuit NS/A by the second bit line selecting circuit SL12. The normal sense amplifier circuit NS/A then latches data in the memory cell MC-3 by using the MISFET Tr2. When the normal operation is the read operation, this latched data is outputted as read data, and when the normal operation is the write operation, the latched data is written as it is or the latched data is inverted and written according to data to be written.

Namely, as stated above, there is the possibility that when both the normal word line NWL for performing the normal operation and the refresh word line RWL for performing the refresh operation are activated and go high, held data is destroyed. Therefore, by using the refresh word line RWL which is already activated in the refresh operation, data for the normal operation is read and written.

Figure 6:
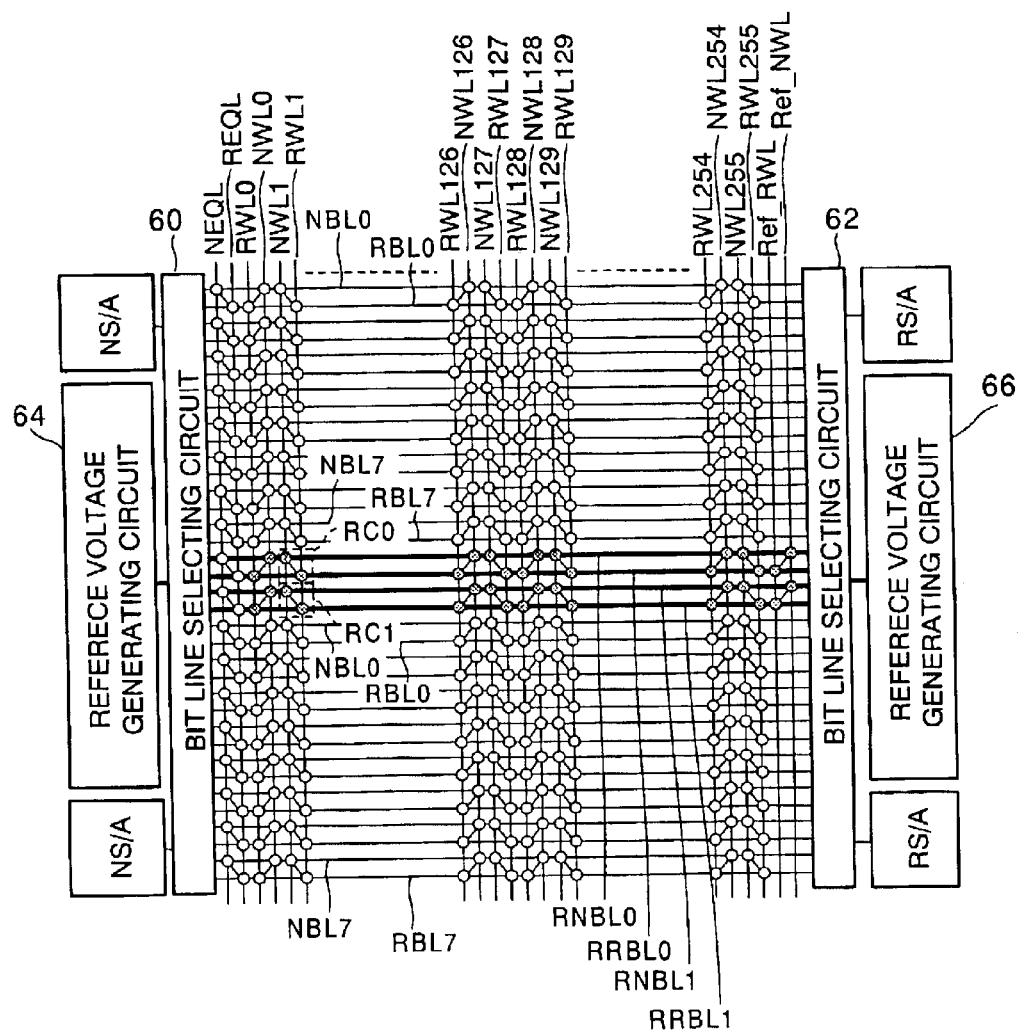
FIG. 6 is a diagram explaining the configuration of the memory cell array and the arrangement of its peripheral circuits according to the first embodiment.

FIG. 6 is an arrangement plan of the memory cell array MCA and its periphery of the semiconductor memory device according to this embodiment. As shown in FIG. 6, in this embodiment, one memory cell array MCA has a memory capacity of 8 Kbits. Specifically, 256 normal word lines NWL0 to NWL255 and 256 refresh word lines RWL0 to RWL255 are provided in parallel with one another along the column direction, and the normal word lines MWL0 to NWL255 and the refresh word lines RWL0 to RWL255 are alternately provided.

Moreover, two groups of eight normal bit lines NBL0 to NBL7 and two groups of eight refresh bit lines RBL0 to RBL7 are provided in parallel with one another along the row direction which intersects the column direction. These normal bit lines NBL0 to NBL7 and refresh bit lines RBL0 to RBL7 are alternately provided. In this embodiment, especially, the normal bit lines NBL0 to NBL7 are provided orthogonal to the normal word lines NWL0 to NWL255 and the refresh word lines RWL0 to RWL255, and the refresh bit lines RBL0 to RBL7 are also provided orthogonal to the normal word lines NWL0 to NWL255 and the refresh word lines RWL0 to RWL255.

Further, in this embodiment, four reference bit lines RNBL0, RRBL0, RNBL1, and RRBL1 are provided in parallel along a bit line direction. Especially in this embodiment, the reference bit lines RNBL0, RRBL0, RNBL1, and RRBL1 are provided in the central portion of the memory cell array MCA. Hence, eight normal bit lines NBL0 to NBL7 and eight refresh bit lines RBL0 to RBL7 are provided on the upper side of the reference bit lines RNBL0, RRBL0, RNBL1, and RRBL1 in FIG. 6, and similarly eight normal bit lines NBL0 to NBL7 and eight refresh bit lines RBL0 to RBL7 are provided on the lower side of the reference bit lines RNBL0, RRBL0, RNBL1, and RRBL1 in FIG. 6. In other words, with respect to the reference bit lines RNBL0, RRBL0, RNBL1, and RRBL1, the number of the normal bit lines NBL and the refresh bit lines RBL provided on one side of a word line direction and the number of the normal bit lines NBL and the refresh bit lines RBL provided on the other side of the word line direction are the same.

The MISFETs Tr1 of the reference cells RC0, in which the "0" data is to be held, are provided at intersection points of the reference bit line RNBL0 and the normal word lines NWL. The MISFETs Tr2 of the reference cells RC0, in which the "0" data is to be held, are provided at intersection points of the reference bit line RRBL0 and the refresh word lines RWL.

The MISFETs Tr1 of the reference cells RC1, in which the "1" data is to be held, are provided at intersection points of the reference bit line RNBL1 and the normal word lines NWL. The MISFETs Tr2 of the reference cells RC1, in which the "1" data is to be held, are provided at intersection points of the reference bit line RRBL1 and the refresh word lines RWL.

The structures of these reference cells RC0 and RC1 are the same as that of the memory cell MC. Moreover, the connection relationship between the MISFETs Tr1 and Tr2 is the same as that of the memory cell MC shown in FIG. 1.

Further, on one end side of the bit line direction in the memory cell array MCA, one normal equalizing line NEQL and one refreshing equalizing line REQL are provided along the normal word lines NWL and the refresh word lines RWL. The MISFETs Tr1 each having the same structure and the same connection relationship as the memory cell MC has are provided at intersection points of the normal equalizing line NEQL and the normal bit lines NBL and intersection points of the normal equalizing line NEQL and the reference bit lines RNBL0 and RNBL1, and their gates are connected to the normal equalizing line NEQL. Furthermore, the MISFETs Tr2 each having the same structure and the same connection relationship as the memory cell MC has are provided at intersection points of the refreshing equalizing line REQL and the refresh bit lines RBL and intersection points of the refreshing equalizing line REQL and the reference bit lines RRBL0 and RRBL1, and their gates are connected to the refreshing equalizing line REQL. Before data is read from the memory cell MC, the normal bit lines NBL or the refresh bit lines RBL are set at a ground (0 V) via this normal equalizing line NEQL or the refreshing equalizing line REQL, and the reference bit lines RNBL0 and RNBL1 or the reference bit lines RRBL0 and RRBL1 are set at the ground.

Moreover, in this embodiment, one reference normal word line Ref_NWL and one reference refresh word line Ref_RWL are formed along the normal word lines NWL and the refresh word lines RWL. The MISFET Tr1 of the reference cell RC0 is placed at an intersection point of the reference normal word line Ref_NWL and the reference bit line RNBL0, and the MISFET Tr2 of the reference cell RC0 is placed at an intersection point of the reference refresh word line Ref_RWL and the reference bit line RRBL0. The MISFET Tr1 of the reference cell RC1 is placed at an intersection point of the reference normal word line Ref_ NWL and the reference bit line RNBL1, and the MISFET Tr2 of the reference cell RC1 is placed at an intersection point of the reference refresh word line Ref_RWL and the reference bit line RRBL1.

On the left side of the memory cell array MCA thus configured in FIG. 6, two normal sense amplifier circuits NS/A and a bit line selecting circuit 60 are placed. On the right side of the memory cell array MCA in FIG. 6, two refresh sense amplifier circuits RS/A and a bit line selecting circuit 62 are placed. Namely, the memory cell array MCA according to this embodiment adopts a double end type sense amplifier system.

Two groups of eight normal bit lines NBL0 to NBL7 and two groups of eight refresh bit lines RBL0 to RBL7 are connected to the bit line selecting circuits 60 and 62 on both sides respectively. By the bit line selecting circuit 60, one out of 16 bit lines NBL0 to NBL7 and RBL0 to RBL7 on the upper side of the reference bit lines RNBL0, RRBL0, RNBL1, and RRBL1 in FIG. 6 is selected and connected to the normal sense amplifier circuit NS/A on the upper side of FIG. 6. Also, by this bit line selecting circuit 60, one out of 16 bit lines NBL0 to NBL7 and RBL0 to RBL7 on the lower side of the reference bit lines RNBL0, RRBL0, RNBL1, and RRBL1 in FIG. 6 is selected and connected to the normal sense amplifier circuit NS/A on the lower side of FIG. 6.

Similarly to the above, by the bit line selecting circuit 62, one out of 16 bit lines NBL0 to NBL7 and RBL0 to RBL7 on the upper side of the reference bit lines RNBL0, RRBL0, RNBL1, and RRBL1 in FIG. 6 is selected and connected to the refresh sense amplifier circuit RS/A on the upper side of FIG. 6. Also, by this bit line selecting circuit 62, one out of 16 bit lines NBL0 to NBL7 and RBL0 to RBL7 on the lower side of the reference bit lines RNBL0, RRBL0, RNBL1, and RRBL1 in FIG. 6 is selected and connected to the refresh sense amplifier circuit RS/A on the lower side of FIG. 6.

One reference voltage generating circuit 64 is provided for two normal sense amplifier circuits NS/A, and one reference voltage generating circuit 66 is provided for two refresh sense amplifier circuits RS/A. When data in the memory cell MC is read, both one reference bit line RNBL0 and one reference bit line RNBL1 are connected to the reference voltage generating circuit 64. Also, both one reference bit line RRBL0 and one reference bit line RRBL1 are connected to the reference voltage generating circuit 66. One normal data sense circuit according to this embodiment has these reference voltage generating circuit 64 and two normal sense amplifier circuits NS/A, and one refresh data sense circuit according to this embodiment has the reference voltage generating circuit 66 and two refresh sense amplifier circuits RS/A.

Next, the concrete circuit configuration of each circuit in FIG. 6 will be explained. The bit line selecting circuit 60 includes the first and second bit line selecting circuits SL10 and SL12 shown in FIG. 5 and a first reference bit line selecting circuit SL20 shown in FIG. 7. In this case, however, since eight normal bit lines NBL0 to NBL7 are provided, eight selection transistors are necessary for the first bit line selecting circuit SL10 in FIG. 5, and since eight refresh bit lines RBL0 to RBL7 are provided, eight selection transistors are necessary for the second bit line selecting circuit SL12 in FIG. 5.

Figure 7:
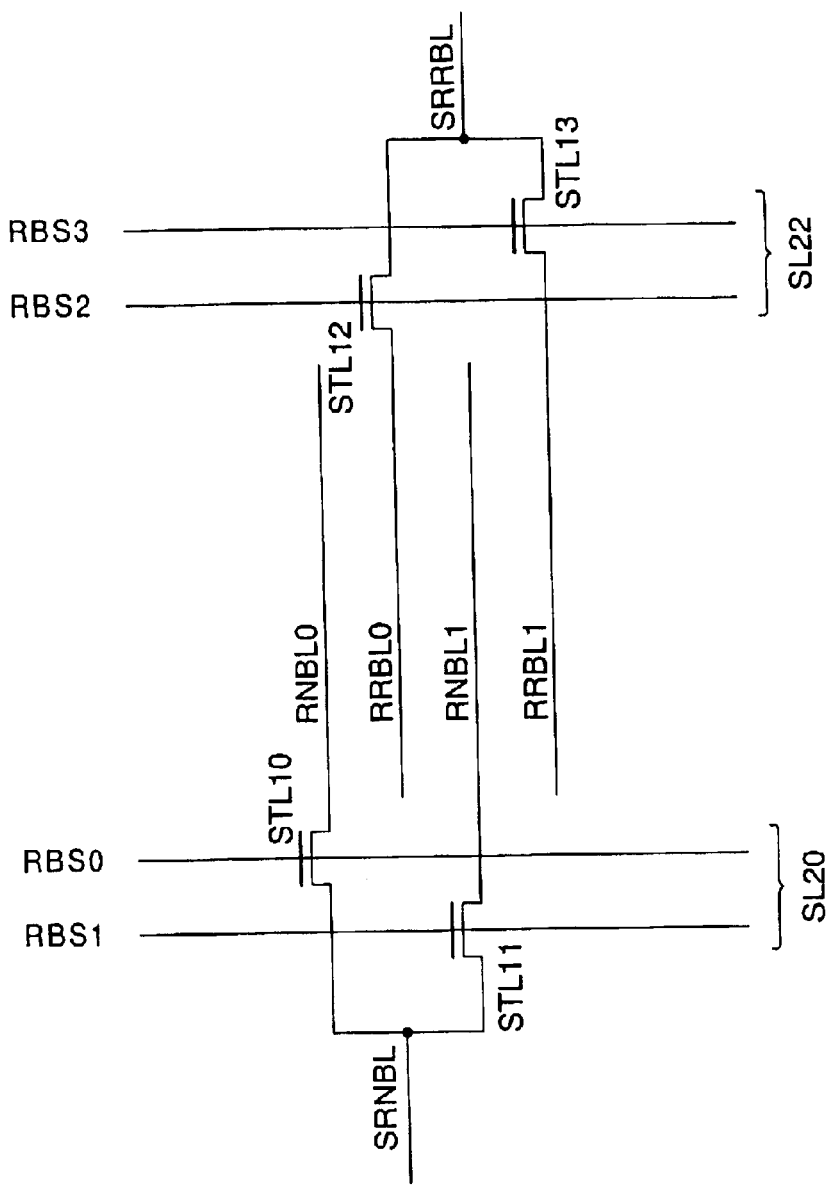
FIG. 7 is a circuit diagram showing the circuit configurations of a first reference bit line selecting circuit and a second reference bit line selecting circuit and their connection relationship with reference bit lines according to the first embodiment.

On the other hand, the bit line selecting circuit 62 includes the third and fourth bit line selecting circuits SL14 and SL16 shown in FIG. 5 and a second reference bit line selecting circuit SL22 shown in FIG. 7. In this case, however, since eight normal bit lines NBL0 to NBL7 are provided, eight selection transistors are necessary for the fourth bit line selecting circuit SL16 in FIG. 5, and since eight refresh bit lines RBL0 to RBL7 are provided, eight selection transistors are necessary for the third bit line selecting circuit SL14.

As shown in FIG. 7, the first reference bit line selecting circuit SL20 includes selection transistors STL10 and STL11. Namely, the reference bit lines RNBL0 and RNBL1 are respectively connected to input terminal sides of the selection transistors STL10 and STL11, and output terminal sides of these selection transistors STL10 and STL11 are connected in common to a selection reference bit line SRNBL. Reference bit line selection signal lines RBS0 and RBS1 are respectively connected to control terminals of the selection transistors STL10 and STL11.

When the normal sense amplifier circuit NS/A reads data in the memory cell MC, both of the reference bit line selection signal lines RBS0 and RBS1 are activated and go high, and thereby both the selection transistors STR10 and STR11 are turned on. Consequently, the reference bit line RNBL0 and the reference bit line RNBL1 are short-circuited. However, when data is written into the reference cells RC0 and RC1, for example, when the reference cells RC0 and RC1 are refreshed, either the reference bit line selection signal line RBS0 or RBS1 is activated and goes high. Namely, when the "0" data is written into the reference cell RC0, the selection transistor STR10 is turned on, and when the "1" data is written into the reference cell RC1, the selection transistor STR11 is turned on.

The second reference bit line selecting circuit SL22 includes selection transistors STL12 and STL13. Namely, the reference bit lines RRBL0 and RRBL1 are respectively connected to input terminal sides of the selection transistors STL12 and STL13, and output terminal sides of these selection transistors STL12 and STL13 are connected in common to a selection reference bit line SRRBL. Reference bit line selection signal lines RBS2 and RBS3 are respectively connected to control terminals of the selection transistors STL12 and STL13.

When the refresh sense amplifier circuit RS/A reads data in the memory cell MC in the refresh operation, both of the reference bit line selection signal lines RBS2 and RBS3 are activated and go high, and thereby both the selection transistors STR12 and STR13 are turned on. Consequently, the reference bit line RRBL0 and the reference bit line RRBL1 are short-circuited. However, when data is written into the reference cells RC0 and RC1, either the reference bit line selection signal line RBS2 or RBS3 is activated and goes high. Namely, when the "0" data is written into the reference cell RC0, the selection transistor STR12 is turned on, and when the "1" data is written into the reference cell RC1, the selection transistor STR13 is turned on.

Figure 8:
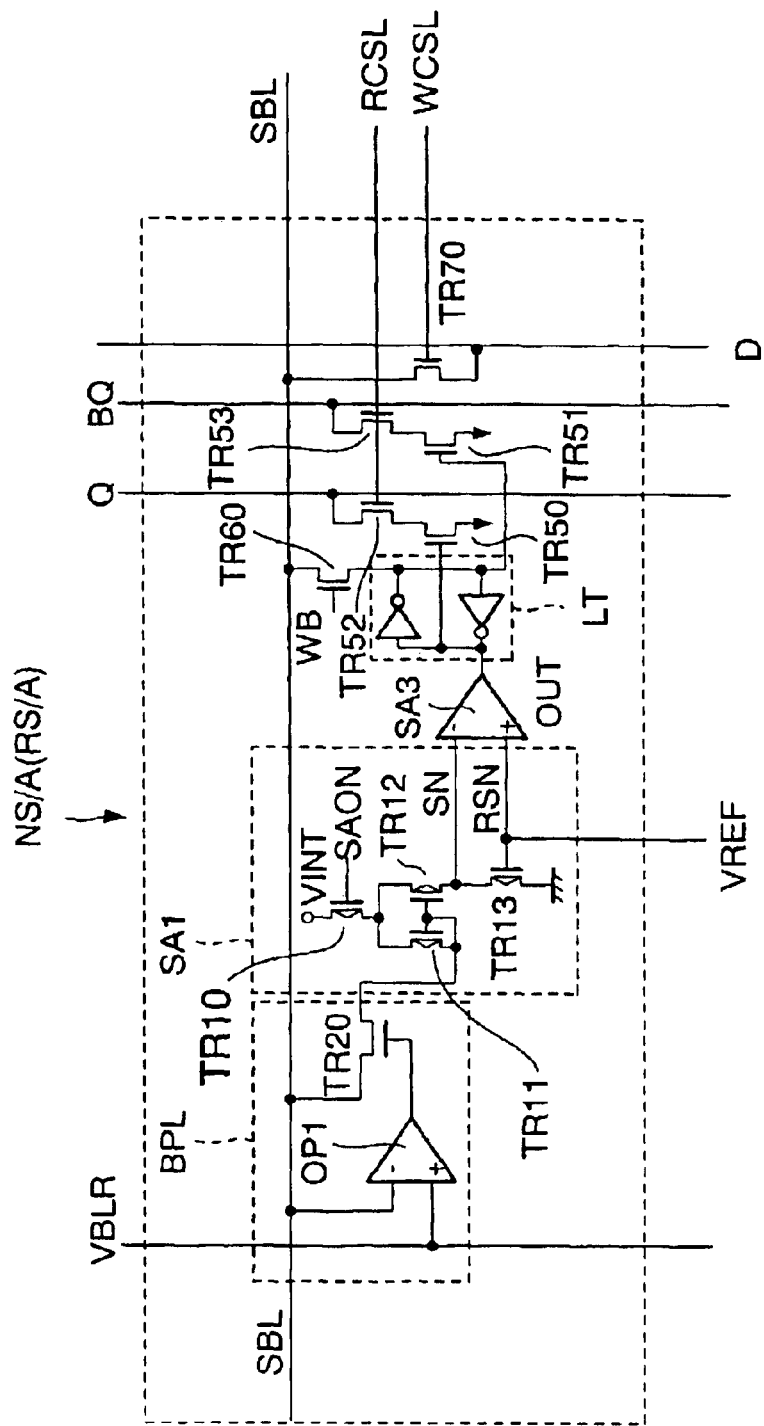
FIG. 8 is a circuit diagram showing the configuration of a normal sense amplifier circuit (refresh sense amplifier circuit) according to the first embodiment.

FIG. 8 is a circuit diagram showing the configuration of the normal sense amplifier circuit NS/A according to this embodiment. It should be noted that the configuration of the refresh sense amplifier circuit RS/A is the same as that of the normal sense amplifier circuit NS/A.

As shown in FIG. 8, the normal sense amplifier circuit NS/A includes a first sense amplifier SA1. This first sense amplifier SA1 includes p-type MISFETs TR10 to TR12 and an n-type MISFET TR13. An input terminal of the MISFET TR10 is connected to a high-level voltage terminal VINT, and an output terminal thereof is connected to input terminals of the MISFET TR11 and the MISFET TR12. Control terminals of these MISFETs TR11 and TR12 are connected to each other to constitute a current mirror circuit. The mirror ratio of the MISFET TR11 to the MISFET TR12 in this current mirror circuit is 1:2. Namely, a current, which is double the current flowing through the MISFET TR11, flows through the MISFET TR12. Moreover, the control terminal and an output terminal of the MISFET TR11 are connected to the selection bit line SBL via an n-type MISFET Tr20 provided in a bit line voltage limiting circuit BPL.

An output terminal of the MISFET TR12 is connected to an input terminal of the MISFET TR13, and an output terminal of the MISFET TR13 is connected to the ground. A node between these MISFET TR12 and MISFET TR13 is a sense node SN.

At the time of the read operation to read data from the memory cell MC, a signal SAON goes low, and the MISFET TR10 is turned on. As a result, a current flows from the high-level voltage terminal VINT to the selection bit line SBL via the MISFET TR11 and the MISFET TR20. This current is the cell current Icell. The amount of the cell current Icell flowing to the selection bit line SBL differs according to data held by the selected memory cell MC. Here, the cell current flowing when the selected memory cell MC holds the "0" data is represented by Icell0, and the cell current flowing when the selected memory cell MC holds the "1" data is represented by Icell1. Whether the cell current is passed through the MISFET Tr1 or the MISFET Tr2 of the selected memory cell MC depends on the aforementioned classification of operations (1) to (7).

The bit line voltage limiting circuit BPL is a circuit for limiting a rise in the voltages of the normal bit lines NBL0 to NBL7 and the refresh bit lines RBL0 to RBL7. Namely, the bit line voltage limiting circuit BPL with the aforementioned MISFET TR20 and an operational amplifier OP1 constitutes a negative feedback control circuit. A voltage VBLR is inputted to a noninverting input terminal of the operational amplifier OP1. In this embodiment, this voltage VBLR is 200 mV. An inverting input terminal of the operational amplifier OP1 is connected to the selection bit line SBL. An output terminal of the operational amplifier OP1 is connected to a control terminal of the MISFET TR20. Therefore, when the voltage of the selection bit line SBL exceeds the voltage VBLR, that is, when the voltage of the normal bit line NBL or the refresh bit line RBL exceeds the voltage VBLR, an output of the operational amplifier OP1 goes low, and the n-type MISFET TR20 is turned off. Consequently, it can be avoided that the voltage of the selected bit line becomes higher than the voltage VBLR.

A rise in the voltages of the normal bit lines NBL0 to NBL7 and the refresh bit lines RBL0 to RBL7 is avoided as described above for the following reason. At the time of data write, a high-level voltage (power supply voltage VDD, for example) is applied to the normal word line NWL, and the high-level voltage (power supply voltage VDD, for example) is also applied to the normal bit line NBL, whereby the memory cell MC performs a pentode operation. Supposing that the power supply voltage VDD is also applied to the normal word line NWL at the time of data read, it is possible that the voltage of the normal bit line NBL rises to the power supply voltage VDD without a sufficient cell current flowing through the memory cell MC. If the voltage of the normal bit line NBL rises to the power supply voltage VDD, the same conditions as those in a write mode are produced. Thus, in this embodiment, the voltage VBLR is set at a value lower than the power supply voltage VDD. For example, the power supply voltage VDD is set at 1 V to 1.5 V and the voltage VBLR=200 mV. Such setting eliminates the possibility that the memory cell MC performs the pentode operation at the time of data read, and consequently it becomes possible not to fulfill conditions of the pentode operation.

Figure 9:
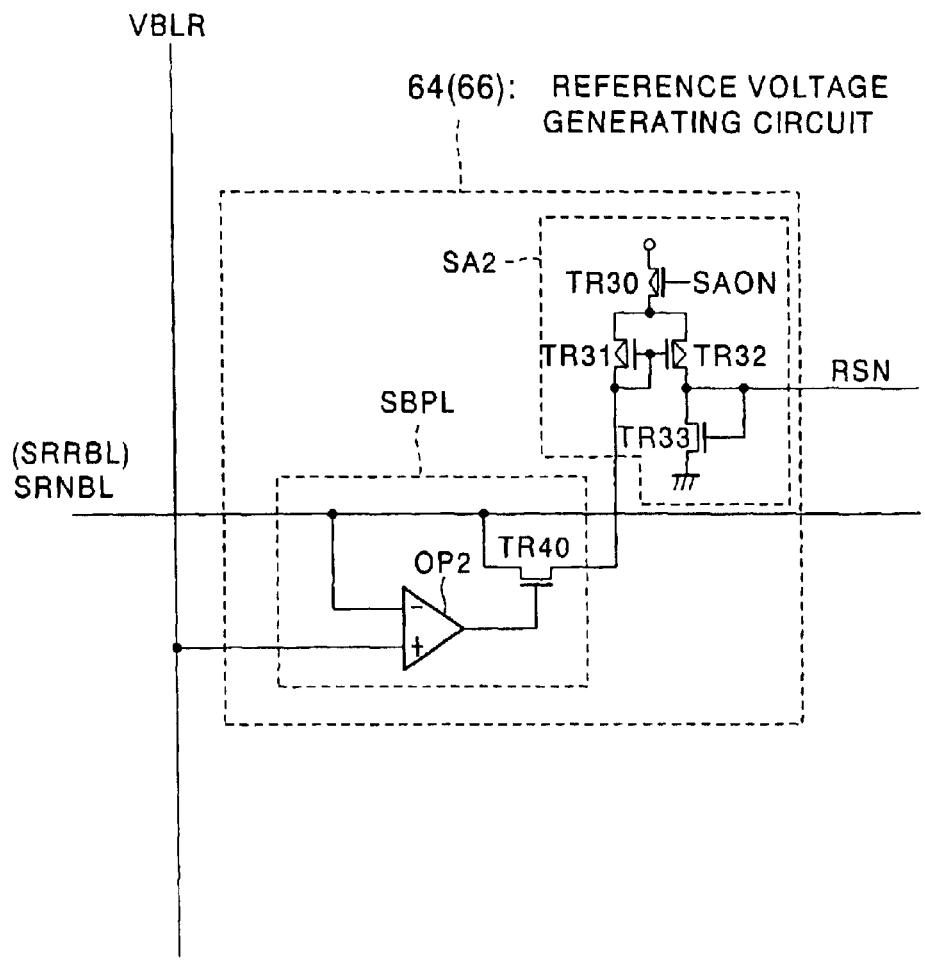
FIG. 9 is a circuit diagram explaining the configuration of a reference voltage generating circuit according to the first embodiment.

FIG. 9 is a circuit diagram showing the configuration of the referenced voltage generating circuit 64 according to this embodiment. It should be noted that the configuration of the reference voltage generating circuit 66 is the same as that of the reference voltage generating circuit 64.

As shown in FIG. 9, a selection reference bit line voltage limiting circuit SBPL for limiting a rise in the voltage of the selection reference bit line SRNBL is provided in the reference voltage generating circuit 64. The reason why the selection reference bit line voltage limiting circuit SBPL is provided is the same as above. This selection reference bit line voltage limiting circuit SBPL includes an operational amplifier OP2 and an n-type MISFET TR40, and the connection relationship between them is the same as that in the aforementioned bit line voltage limiting circuit BPL.

The reference voltage generating circuit 64 includes a second sense amplifier SA2. This second sense amplifier SA2 includes p-type MISFETs TR30 to TR32 and an n-type MISFET TR33, and the connection relationship among them is the same as that in the aforementioned sense amplifier SA1. However, the mirror ratio of a current mirror circuit including the MISFET TR31 and the MISFET TR32 is 1:1. Namely, a current whose amount is the same as the amount of a current flowing through the MISFET TR31 flows through the MISFET TR32. A portion between the MISFET TR32 and the MISFET TR33 constitutes a reference node RSN, and a control terminal of the MISFET TR33 is connected to the reference node RSN.

Further, as can be seen from FIG. 9 and FIG. 8, the reference node RSN is connected to a control terminal of the MISFET TR13 of the first sense amplifier SA1. Hence, a current mirror circuit includes the MISFET TR33 and the MISFET TR13. The mirror ratio of this current mirror circuit is 1:1.

As shown in FIG. 9, in the read operation, the signal SAON goes low, and the MISFET TR30 is turned on. Therefore, a current flows from the high-level voltage terminal VINT to the selection reference bit line SRNBL via the MISFET TR31 and the MISFET TR40. This is a reference current. This reference current has an amount which is the sum of the amount of the current Icell0 flowing through the reference cell RC0 holding the data "0" and the amount of the current Icell1 flowing through the reference cell RC1 holding the data "1". In this case, since the reference voltage generating circuit 64 is connected to the reference bit lines RNBL0 and RNBL1, the reference current is passed through the MISFETs Tr1 of the reference cells RC0 and RC1.

Figure 10:
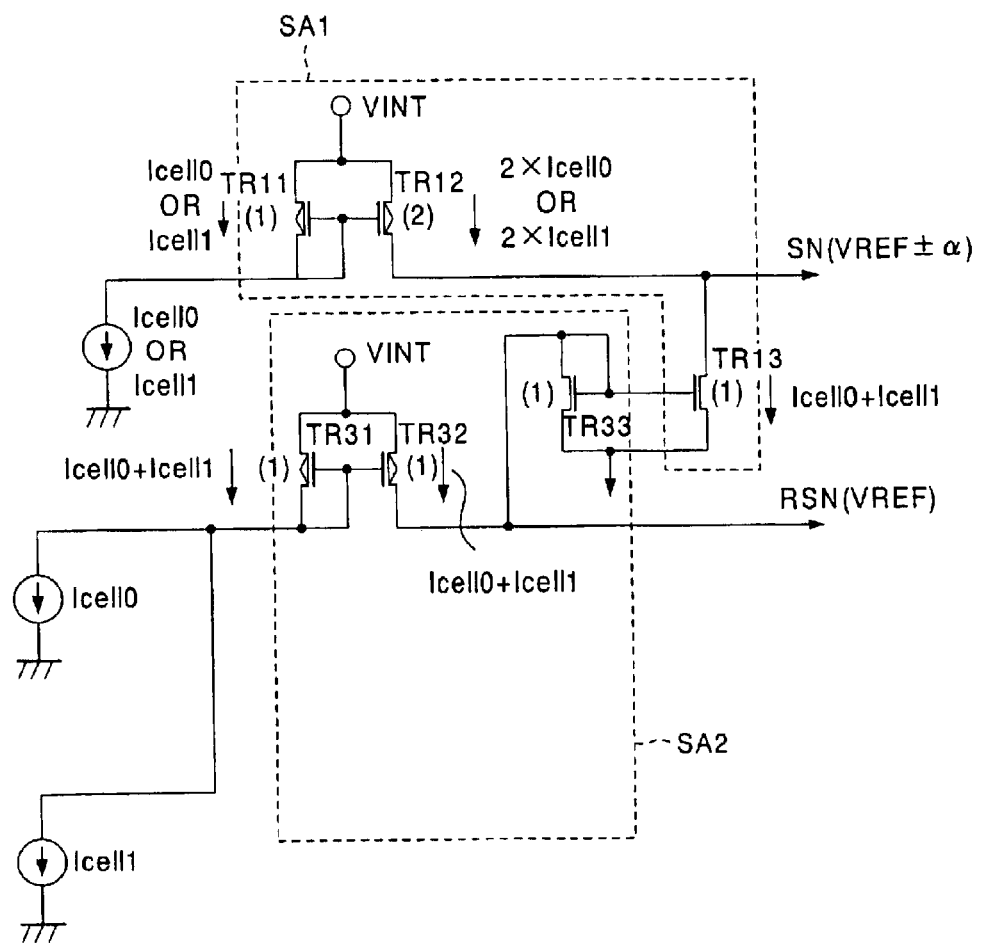
FIG. 10 is a diagram showing equivalent circuits of a first sense amplifier of the sense amplifier circuit and a second sense amplifier of the reference voltage generating circuit according to the first embodiment.

FIG. 10 is a diagram showing equivalent circuits of the first sense amplifier SA1 and the second sense amplifier SA2 in the data read operation. Numerical values in parentheses by the side of MISFETs represent mirror ratios of the current mirror circuits.

As can be seen from FIG. 10, the cell current Icell (Icell0 or Icell1) flowing through the memory cell MC from which data is read is doubled by the current mirror circuit including the MISFET TR11 and the MISFET TR12, and a current of 2× Icell flows through the MISFET TR12.

On the other hand, the reference current Icell0+Icell1 is multiplied by one by the current mirror circuit including the MISFET TR31 and the MISFET TR32. The voltage of the reference node RSN at this time is the reference voltage VREF. Moreover, the reference current Icell0+Icell1 is multiplied by one by the current mirror circuit including the MISFET TR33 and MISFET TR13, and then the reference current Icell0+Icell1 flows through the MISFET TR13. By a collision of the reference current Icell0+Icell1 which flows through the MISFET TR13 and the double cell current 2×Icell which flows through the MISFET TR12, the voltage (data voltage) of the sense node SN is fixed.

More specifically, when the 2×Icell is smaller than the reference current Icell0+Icell1, force which turns on the MISFET TR13 and pass the current Icell0+Icell1 is stronger than force which turns on the MISFET TR12 and pass the current 2× Icell. Hence, the data voltage of the sense node SN is lower than the reference voltage VREF, and it is VREF−α.

On the other hand, when the 2× Icell is larger than the reference current Icell0+Icell1, the force which turns on the MISFET TR12 and pass the current 2×Icell is stronger than the force which turns on the MISFET TR13 and pass the current Icell0+Icell1. Hence, the data voltage of the sense node SN is higher than the reference voltage VREF, and it is VREF+α.

As can be seen from above, the polarity of the difference between the voltage of the sense node SN and the voltage of the reference node RNS differs according to data. This voltage difference is sensed by a third sense amplifier SA3 as shown in FIG. 8. In this embodiment, the third sense amplifier SA3 has an operational amplifier and outputs a low-level or high-level sense output OUT depending on whether the voltage of the sense node SN is higher or lower than that of the reference node RSN. This sense output OUT is latched by a latch circuit LT.

The sense output OUT latched by the latch circuit LT turns on either an n-type MISFET TR50 or an n-type MISFET TR51 according to whether it is high or low. A read column selection signal RCSL is inputted to control terminals of an n-type MISFET TR52 and an n-type MISFET TR53, and the read column selection signal RCSL is high in the sense amplifier circuit having the selected memory cell MC, whereby these MISFETs TR52 and TR53 are on. Moreover, in the read operation, data read lines Q and BQ are both precharged high. Therefore, either the data read line Q or the data read line BQ dischanges to a low level according to whether the sense output OUT is high or low. Consequently, it becomes possible to output the read data to the outside.

In a write-back operation, a write-back signal WB goes high, and an n-type MISFET TR60 is turned on. Thereby, the sense output OUT latched by the latch circuit LT is outputted to the selection bit line SBL, and data is written again to the selected memory cell MC.

When data is written into the memory cell MC, a write column selection signal WCSL goes high, and an n-type MISFET TR70 is turned on. Then, a data write line D is set high or low according to the data to be written, and outputted to the selection bit line SBL. For example, in this embodiment, when the data "1" is written, the data write line D goes high, and holes which are majority carriers are accumulated in the floating body of the memory cell MC selected by the word line WL driven high. On the other hand, when the data "0" is written, the data write line D goes low, and the accumulated holes are extracted from the floating body of the memory cell MC selected by the word line WL driven low. Consequently, the data can be written into the selected memory cell MC.

Incidentally, in the semiconductor memory device in FIG. 6, in order to cope with the aforementioned operations (6) and (7), the reference normal word line Ref_NWL and the reference refresh word line Ref_RWL are additionally provided, and the reference cells RC0 and RC1 are additionally arranged. Namely, concerning the operations (1) to (5), when the normal sense amplifier circuit NS/A is activated, it is suitable that the reference voltage generating circuit 64 use the reference cells RC0 and RC1 provided at the intersection points of the activated normal word line NWL and the reference bit lines RNBL0 and RNBL1. Moreover, when the refresh sense amplifier circuit RS/A is activated, it is suitable that the reference voltage generating circuit 66 use the reference cells RC0 and RC1 provided at the intersection points of the activated refresh word line RWL and the reference bit lines RRBL0 and RRBL1.

In the case of the operations (6) and (7), however, their circumstances are somewhat different. For example, in the case of the operation (6), read in the refresh operation is performed by the use of the normal word line NWL which is activated for the normal operation. However, the reference cells RC0 and RC1 which are activated by the normal word line NWL activated for the normal operation are used for the normal operation by the reference voltage generating circuit 64 on the normal sense amplifier circuit NS/A side. Therefore, unless some measures are taken, the reference cells RC0 and RC1 which can be used by the reference voltage generating circuit 66 on the refresh sense amplifier circuit RS/A side do not exist. Hence, in this embodiment, in the case of the operation (6), the reference refresh word line Ref_RWL is activated for the refresh operation, and the reference cells RC0 and RC1, which are used by the reference voltage generating circuit 66 on the refresh sense amplifier circuit RS/A side, are additionally provided.

This also applies to the case of the operation (7). Namely, in the case of the operation (7), read in the normal operation is performed by the use of the refresh word line RWL which is activated for the refresh operation. However, the reference cells RC0 and RC1 which are activated by the refresh word line RWL activated for the refresh operation are used for the refresh operation by the reference voltage generating circuit 66 on the refresh sense amplifier circuit RS/A side. Therefore, unless some measures are taken, the reference cells RC0 and RC1 which can be used by the reference voltage generating circuit 64 on the normal sense amplifier circuit NS/A side do not exist. Hence, in this embodiment, in the case of the operation (7), the reference normal word line Ref_NWL is activated for the normal operation, and the reference cells RC0 and RC1, which are used by the reference voltage generating circuit 64 on the normal sense amplifier circuit NS/A side, are additionally provided.

Next, the processing for classifying the operation into the aforementioned operations (1) to (7) will be explained by means of a flowchart. However, since the operations (1) and (2) are the normal operation, the explanation thereof is omitted.

Figure 11:
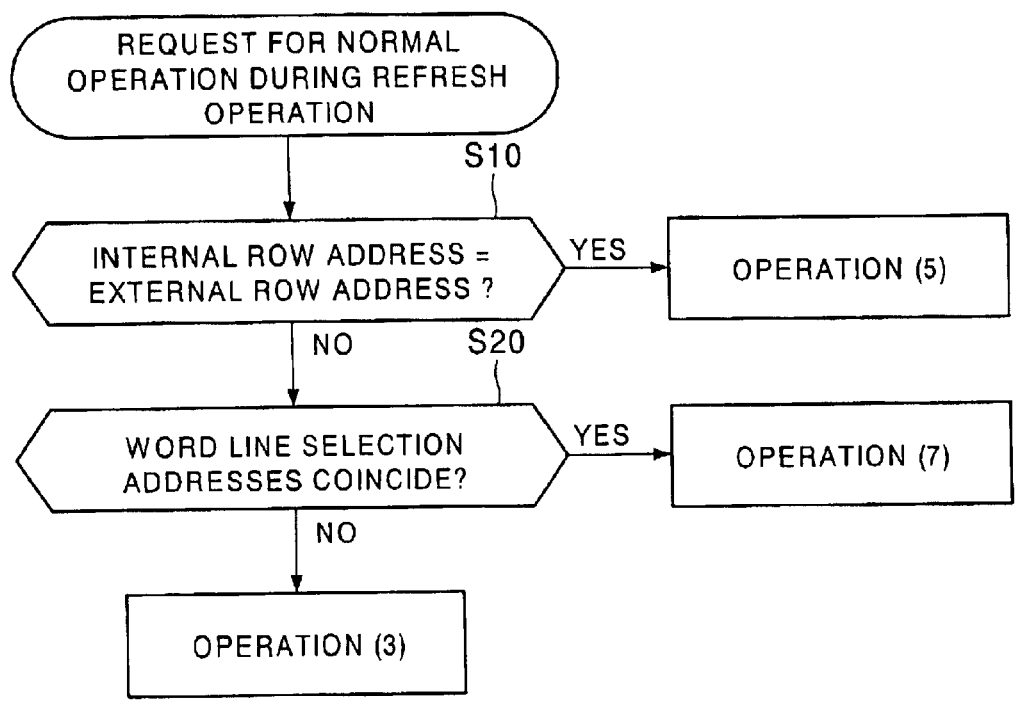
FIG. 11 is a flowchart explaining the contents of operation determining processing executed by a semiconductor memory device according to the first embodiment (a request for a normal operation during a refresh operation)

FIG. 11 is a flowchart explaining operation determining processing when a request for the normal operation is made to the memory cell array MCA which is performing the refresh operation. As shown in FIG. 11, it is determined whether an internal row address for refresh from a refresh counter coincides with an external row address inputted for the normal operation from the outside (Step S10). In this embodiment, a row address is composed of 13 bits of ADD0 to ADD12. A word line selection address is decided by eight bits of ADD0 to ADD7, a bit line selection address is decided by three bits of ADD8 to ADD10, and an array allocation address is decided by two bits of ADD11 to ADD12. Namely, in Step S10, it is determined whether these addresses each composed of 13 bits perfectly coincide with each other.

When the internal row address and the external row address coincide with each other (Step S10: Yes), this means that the memory cells MC to be selected are the same, and hence this case is determined to be the operation (5).

On the other hand, when the internal row address and the external row address do not coincide (Step S10: No), it is determined whether the word line selection address of the internal row address and the word line selection address of the external row address coincide (Step S20). More specifically, it is determined whether the eight bits ADD0 to ADD7 of the internal row address and the eight bits ADD0 to ADD7 of the external row address coincide. When both of them coincide (Step S20: Yes), this means that the memory cells MC are different although they have the same word line selection address, and hence this case is determined to be the operation (7). On the other hand, when both of them do not coincide (Step S20: No), this means that the word line selection addresses are different, and hence this case is determined to be the operation (3).

Figure 12:
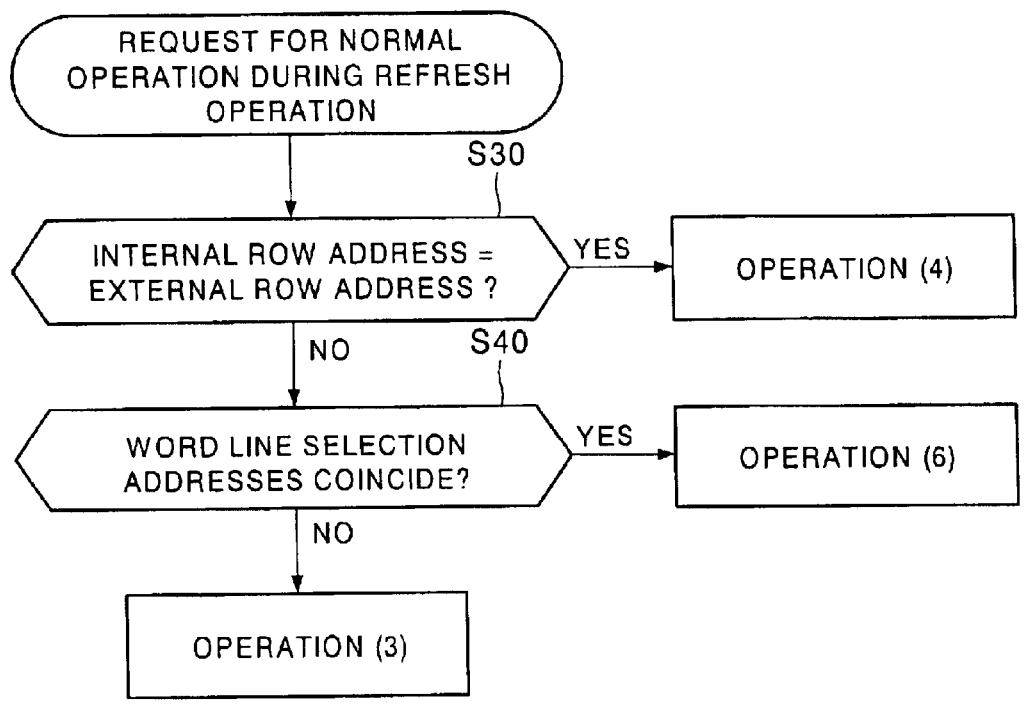
FIG. 12 is a flowchart explaining the contents of the operation determining processing executed by the semiconductor memory device according to the first embodiment (a request for the refresh operation during the normal operation)

FIG. 12 is a flowchart explaining operation determining processing when a request for the refresh operation is made to the memory cell array MCA which is performing the normal operation. As shown in FIG. 12, it is determined whether the internal row address for refresh from the refresh counter coincides with the external row address inputted for the normal operation from the outside (Step S30). Specifically, it is determined whether these row addresses each composed of 13 bits perfectly coincide with each other.

When the internal row address and the external row address coincide with each other (Step S30: Yes), this means that the memory cells MC to be selected are the same, and hence this case is determined to be the operation (4).

On the other hand, when the internal row address and the external row address do not coincide (Step S30: No), it is determined whether the word line selection address of the internal row address and the word line selection address of the external row address coincide (Step S40). More specifically, it is determined whether the eight bits ADD0 to ADD7 of the internal row address and the eight bits ADD0 to ADD7 of the external row address coincide. When both of them coincide (Step S40: Yes), this means that the memory cells MC are different although they have the same word line selection address, and hence this case is determined to be the operation (6). On the other hand, when both of them do not coincide (Step S40: No), this means that the word line selection addresses are different, and hence this case is determined to be the operation (3).

Figure 13:
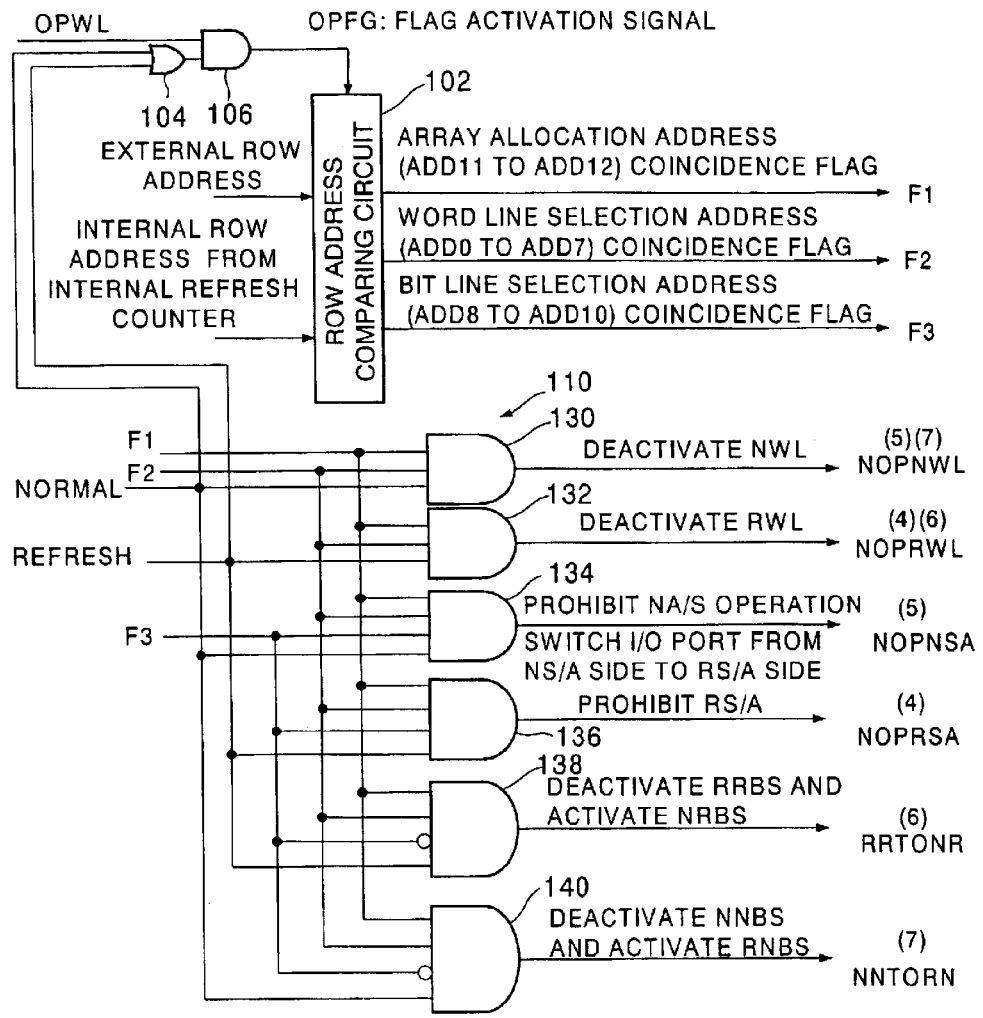
FIG. 13 is a diagram explaining input/output signals of a row address comparing circuit and the configuration of an array controller according to the first embodiment.
Figure 14:
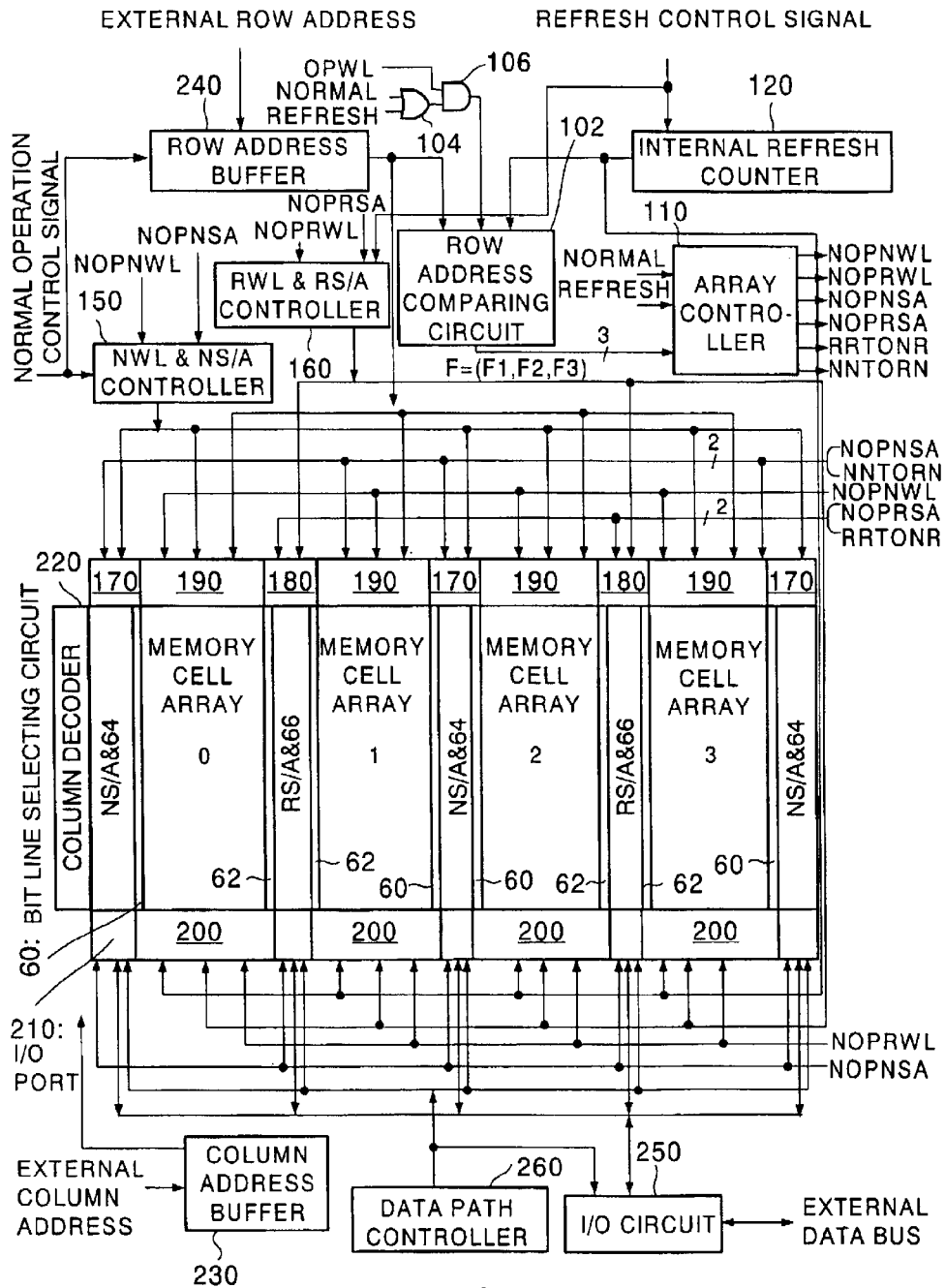
FIG. 14 is a circuit arrangement plan of the semiconductor memory device according to the first embodiment.

An operation determining logic circuit for performing such operation determining processing is shown in FIG. 13, and an arrangement plan of a semiconductor memory device into which the operation determining logic circuit in FIG. 13 is incorporated is shown in FIG. 14.

As shown in FIG. 13, the operation determining logic circuit according to this embodiment includes a row address comparing circuit 102, an OR circuit 104, an AND circuit 106, and an array controller 110.

A normal operation signal NORMAL and a refresh operation signal REFRESH are inputted to the OR circuit 104. The normal operation signal NORMAL is a signal which goes high when a request for the normal operation is inputted. The refresh operation signal REFRESH is a signal which goes high when a request for the refresh operation is inputted. An output of the OR circuit 104 is inputted to the AND circuit 106. A word line activation signal OPWL is also inputted to the AND circuit 106. This word line activation signal OPWL is a signal which goes high when the normal word line NWL or the refresh word line RWL is activated. A flag activation signal OPFG which is an output of the AND circuit 106 is inputted to the row address comparing circuit 102. Namely, this flag activation signal OPFG is a signal which goes high when the normal word line NWL or the refresh word line RWL is activated when a request for the normal operation or a request for the refresh operation is inputted. In other words, it is a signal which goes high when the normal operation and the refresh operation overlap each other.

An external row address designated by the normal operation from the outside and an internal row address from an internal refresh counter 120 (See FIG. 14) are inputted to the row address comparing circuit 102. When the flag activation signal OPFG is high, the row address comparing circuit 102 compares the external row address and the internal row address, drives an array allocation address coincidence flag F1 high when respective two bits of ADD11 and ADD12 coincide, drives a word line selection address coincidence flag F2 high when respective eight bits of ADD0 to ADD7 coincide, and drives a bit line selection address coincidence flag F3 high when respective three bits of ADD8 to ADD10 coincide. These flags F1 to F3 are inputted to the array controller 110.

The array controller 110 includes AND circuits 130 to 140. The AND circuit 130 drives a control signal NOPNWL, which deactivates the normal word line NWL, high when the array allocation addresses (flag F1=high) and the word line selection addresses (flag F2=high) respectively coincide and the normal operation signal NORMAL goes high. This is the case of the aforementioned operations (5) and (7).

The AND circuit 132 drives a control signal NOPRWL, which deactivates the refresh word line RWL, high when the array allocation addresses (flag F1=high) and the word line selection addresses (flag F2=high) respectively coincide and the refresh operation signal REFRESH goes high. This is the case of the aforementioned operations (4) and (6).

The AND circuit 134 drives a control signal NOPNSA, which prohibits the operation of the normal sense amplifier circuit NS/A and switches the I/O port to the refresh sense amplifier circuit RS/A, high when the array allocation addresses (flag F1=high), the word line selection addresses (flag F2=high), and the bit line selection addresses (flag F3=high) respectively coincide and the normal operation signal NORMAL goes high. This is the case of the aforementioned operation (5).

The AND circuit 136 drives a control signal NOPRSA, which prohibits the operation of the refresh sense amplifier circuit RS/A, high when the array allocation addresses (flag F1=high), the word line selection addresses (flag F2=high), and the bit line selection addresses (flag F3=high) respectively coincide and the refresh operation signal REFRESH goes high. This is the case of the aforementioned operation (4).

The AND circuit 138 drives a control signal RRTONR, which deactivates the third bit line selecting circuit SL14 and activates the fourth bit line selecting circuit SL16, high when the array allocation addresses (flag F1=high) and the word line selection addresses (flag F2=high) respectively coincide but the bit line selection addresses (flag F3=low) do not coincide and the refresh operation signal REFRESH goes high. This is the case of the aforementioned operation (6).

The AND circuit 140 drives a control signal NNTORN, which deactivates the first bit line selecting circuit SL10 and activates the second bit line selecting circuit SL12, high when the array allocation addresses (flag F1=high) and the word line selection addresses (flag F2=high) respectively coincide but the bit line selection addresses (flag F3=low) do not coincide and the normal operation signal NORMAL goes high. This is the case of the aforementioned operation (7).

As shown in FIG. 14, the control signal NOPNWL and the control signal NOPNSA out of the control signals outputted from the array controller 110 are inputted to a controller 150 for controlling the normal word lines NWL and the normal sense amplifier circuits NS/A. The control signal NOPRWL and the control signal NOPRSA are inputted to a controller 160 for controlling the refresh word lines RWL and the refresh sense amplifier circuits RS/A. The control signal NOPNSA and the control signal NNTORN are inputted to drivers 170 for drive-controlling the normal sense amplifier circuits NS/A and the bit line selecting circuits 60. The control signal NOPRSA and the control signal PRTONR are inputted to drivers 180 for drive-controlling the refresh sense amplifier circuits RS/A and the bit line selecting circuits 62. The control signal NOPNWL is inputted to decoders and drivers 190 for the normal word lines NWL arranged on the upper sides of respective memory cell arrays 0 to 3 in the word line direction. The control signal NOPRWL is inputted to decoders and drivers 200 for the refresh word lines RWL arranged on the lower sides of the respective memory cell arrays 0 to 3 in the word line direction. The control signal NOPNSA is inputted to I/O ports 210.

Moreover, as shown in FIG. 14, the semiconductor memory device according to this embodiment includes four memory cell arrays 0 to 3. The memory cell arrays MCA adjacent to each other in the bit line direction share the normal sense amplifier circuit NS/A and the reference voltage generating circuit 64 or share the refresh sense amplifier circuit RS/A and the reference voltage generating circuit 66.

A column decoder 220 is provided on the left end side of these memory cell arrays, and an external column address inputted from the outside is inputted thereto via a column address buffer 230. On the other hand, an external row address inputted from the outside is inputted to a row address buffer 240. The row address is inputted from the row address buffer 240 to the aforementioned row address comparing circuit 102, and the decoders and drivers 190 for the normal word lines NWL, and an internal address outputted from the internal refresh counter 120 for refresh is inputted to the aforementioned row address comparing circuit 102 and the decoders and drivers 200 for the refresh word lines RWL.

Data read from the memory cell arrays 0 to 3 and data to be written into the memory cell arrays 0 to 3 are sent to and received from an external data bus via an I/O circuit 250. The I/O circuit 250 and the I/O ports 210 are controlled by a data path controller 260.

Figure 15:
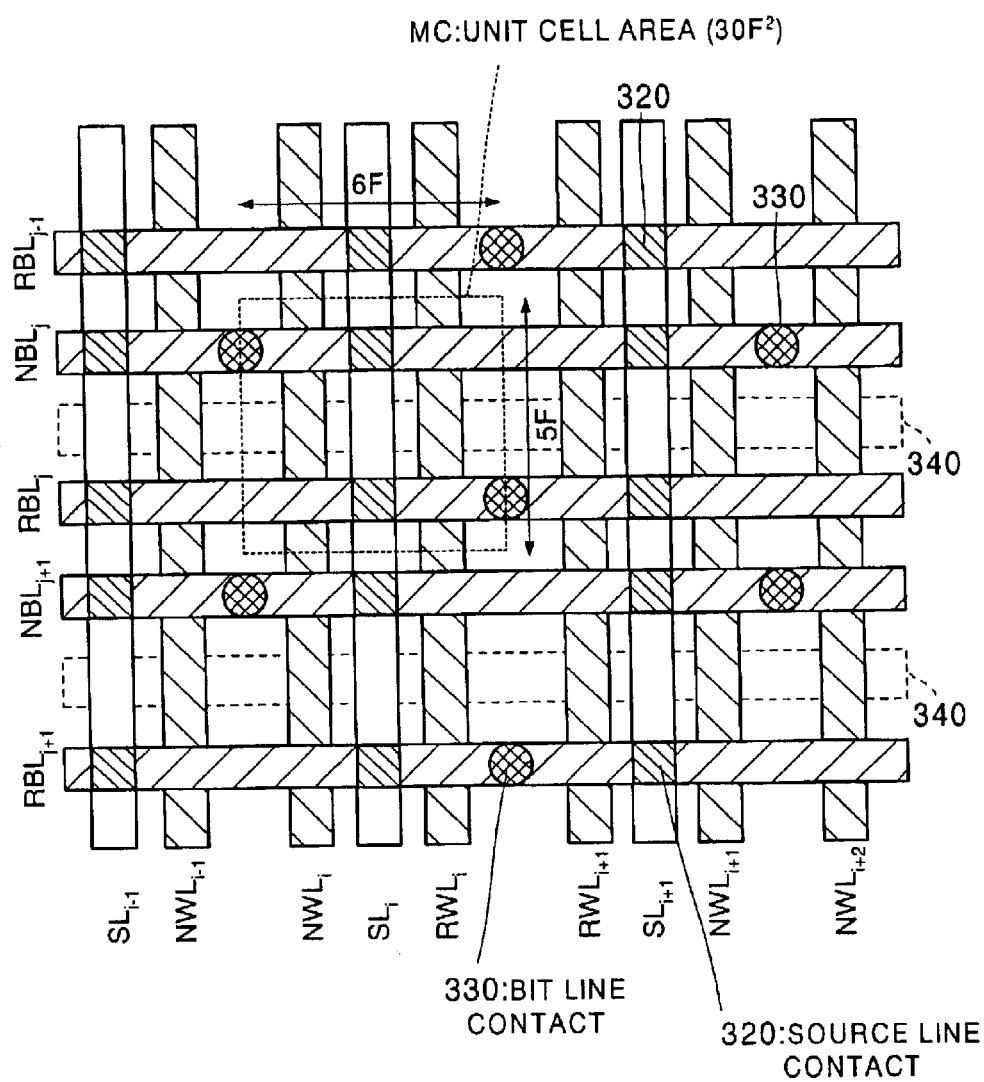
FIG. 15 is a plan view explaining the layout of the memory cell array according to the first embodiment.
Figure 16A:
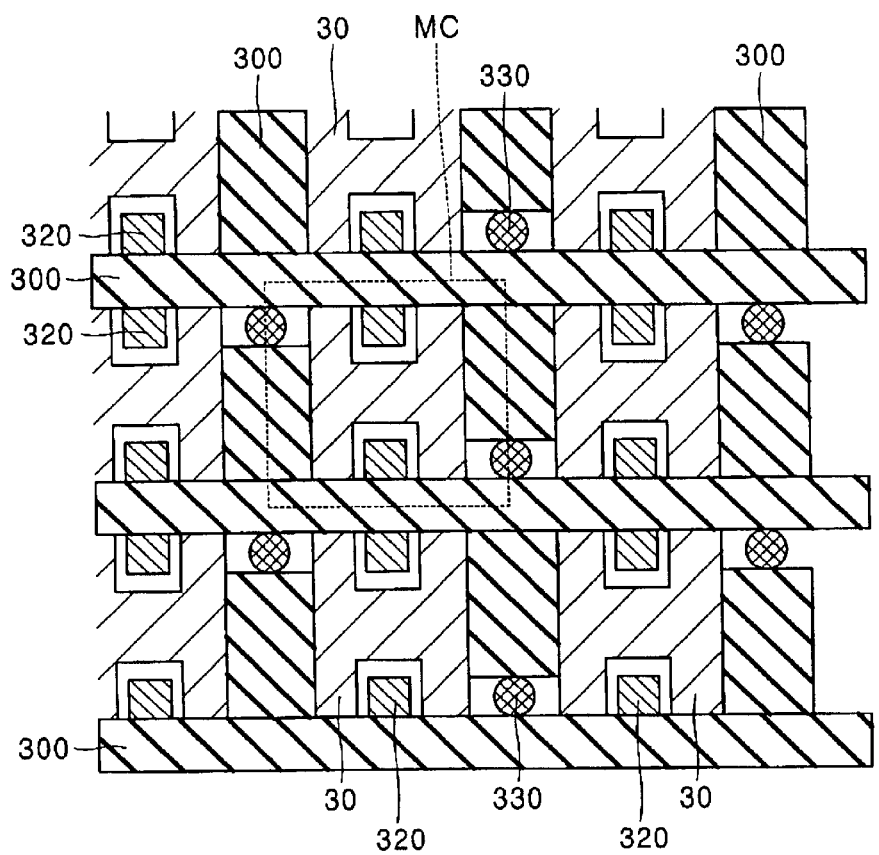
FIG. 16A is a plan view explaining the layout of the memory cell array according to the first embodiment.

Next, a memory cell layout when the aforementioned memory cell array MCA including the memory cells MC is formed on a semiconductor substrate will be explained. FIG. 15 and FIG. 16A are diagrams showing the memory cell array layout of the memory cell array MCA according to this embodiment in top down view. FIG. 15 is a diagram particularly showing the layout relationship among the normal word lines NWL, the refresh word lines RWL, the normal bit lines NBL, and the refresh bit lines RBL, and FIG. 16A is a diagram particularly showing the layout relationship between device isolation regions 300 and floating bodies 30.

As shown in FIG. 15 and FIG. 16A, the n-type source regions 26 shown in FIG. 2 or the n-type source regions 46 shown in FIG. 3 are formed in the semiconductor substrate under the source line contacts 320. Source lines SL are connected to theses source regions 26 or the source regions 46 by the source line contacts 320. The source lines SL are formed in parallel with the normal word lines NWL and the refresh word lines RWL.

Moreover, the n-type drain regions 28 shown in FIG. 2 or the n-type drain regions 48 shown in FIG. 3 are formed in the semiconductor substrate under the bit line contacts 330. The normal bit lines NBL are connected to the source regions 26, and the refresh bit lines RBL are connected to the source regions 46.

In this embodiment, one memory cell MC has a length of 5 F (F is the minimum line width) in the word line direction and a length of 6 F in the bit line direction. Hence, the unit cell area is 30 $F^2$.

As shown in FIG. 16A, the p-type floating bodies 30 shared by the MISFETs Tr1 and MISFETs Tr2 are each formed in the shape of an H in top down view. They are arranged in such a manner that one end portion of each of the floating bodies 30 is located between the source line contact 320 and the bit line contact 330. As shown in FIG. 15, the normal word lines NWL or the refresh word lines RWL, which constituting gate electrodes, are located between the source line contacts 320 and the bit line contacts 330. Such a location relationship is adopted in order for the normal word lines NWL and the refresh word lines RWL not to overlap each other.

In FIG. 15 and FIG. 16A, gate electrodes of the MISFETs Tr1 in the memory cells MC adjacent to one another in the column direction are formed continuously to constitute the normal word line NWL, and gate electrodes of the MISFETs Tr2 are also formed continuously to constitute the refresh word line RWL. Accordingly, in this embodiment, the gate electrode connected to the word line includes a case where the word line and the gate electrode are formed out of different materials and they are electrically connected, and in addition a case where the gate electrode is formed integrally with the word line. This applies to connection in other portions such as the source region and the drain region.

The floating bodies 30 thus shaped can be formed by forming the normal word lines NWL and the refresh word lines RWL on p-type semiconductor layer 24 and thereafter implanting n-type ions while masking regions 340 enclosed by a dotted line in FIG. 15.

Moreover, the memory cells MC are isolated from each other by the device isolation regions 300. The device isolation regions 300 are formed, for example, by STI (shallow trench isolation) made of $SiO_2$.

As stated above, according to the semiconductor memory device according to this embodiment, one memory cell MC includes two MISFET Tr1 and MISFET Tr2 which share the floating body 30, and consequently this memory cell MC can be accessed from both the MISFET Tr1 and the MISFET Tr2.

Moreover, two word lines and two bit lines can be connected to such a memory cell MC, and therefore, the memory cell array MCA including such memory cells MC can perform the refresh operation in the background. Accordingly, a situation in which this semiconductor memory device is brought into a busy state by the refresh operation, so that access from the outside is limited can be avoided.

Further, the cell size of a memory cell in a hitherto used 6-transitor SRAM is approximately 100 $F^2$, whereas the cell size of the memory cell MC in this embodiment is 30 $F^2$, and thus the cell size can be made smaller than in the related art.

Furthermore, concerning the process of manufacturing the memory cells MC according to this embodiment, a manufacturing process when a logic circuit such as a CPU is formed on an SOI can be applied. Accordingly, the memory cells MC according to this embodiment can be easily formed on the same chip as the logic circuit.

Figure 16B:
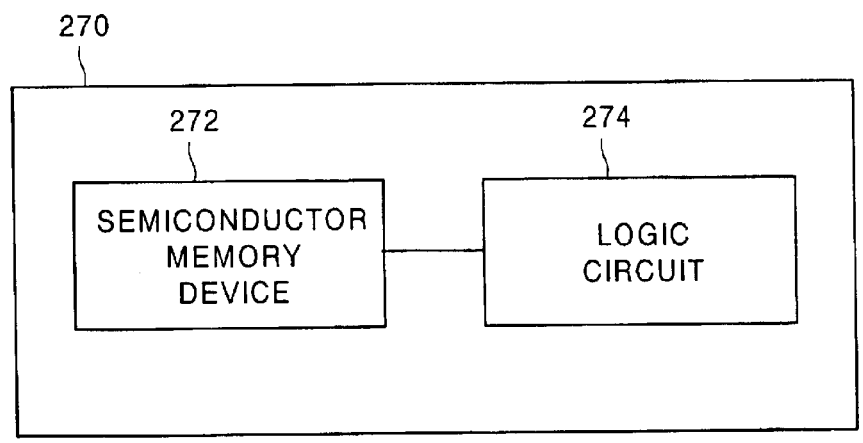
FIG. 16B is a diagram explaining a semiconductor device including a semiconductor memory device according to the first embodiment and a logic circuit which are formed on a single semiconductor chip.

From such a point of view, specially, the semiconductor memory device according to this embodiment is suitable for application as a second level or third level cache memory to the CPU. Besides, the semiconductor memory device according to this embodiment can be treated in the same manner as a hitherto used SRAM interface even when it is mounted mixedly with the logic circuit such as the CPU, thereby providing very high convenience. That is, as shown in FIG. 16B, the semiconductor memory device 272 according to this embodiment and a logic circuit 274 which operates using the semiconductor memory device 272 can be easily formed on a single semiconductor chip 270.

[Second Embodiment]

The normal operation and the refresh operation can be performed in parallel in the semiconductor memory device according to the aforementioned first embodiment. In this embodiment, the cycle time for memory access can be halved by doubling the normal operation by adopting the same method. In this case, however, it is necessary to define the refresh operation aside from the normal operation, and hence there exists a period of time during which access by the normal operation is prohibited. Further details will be explained below.

Figure 17:
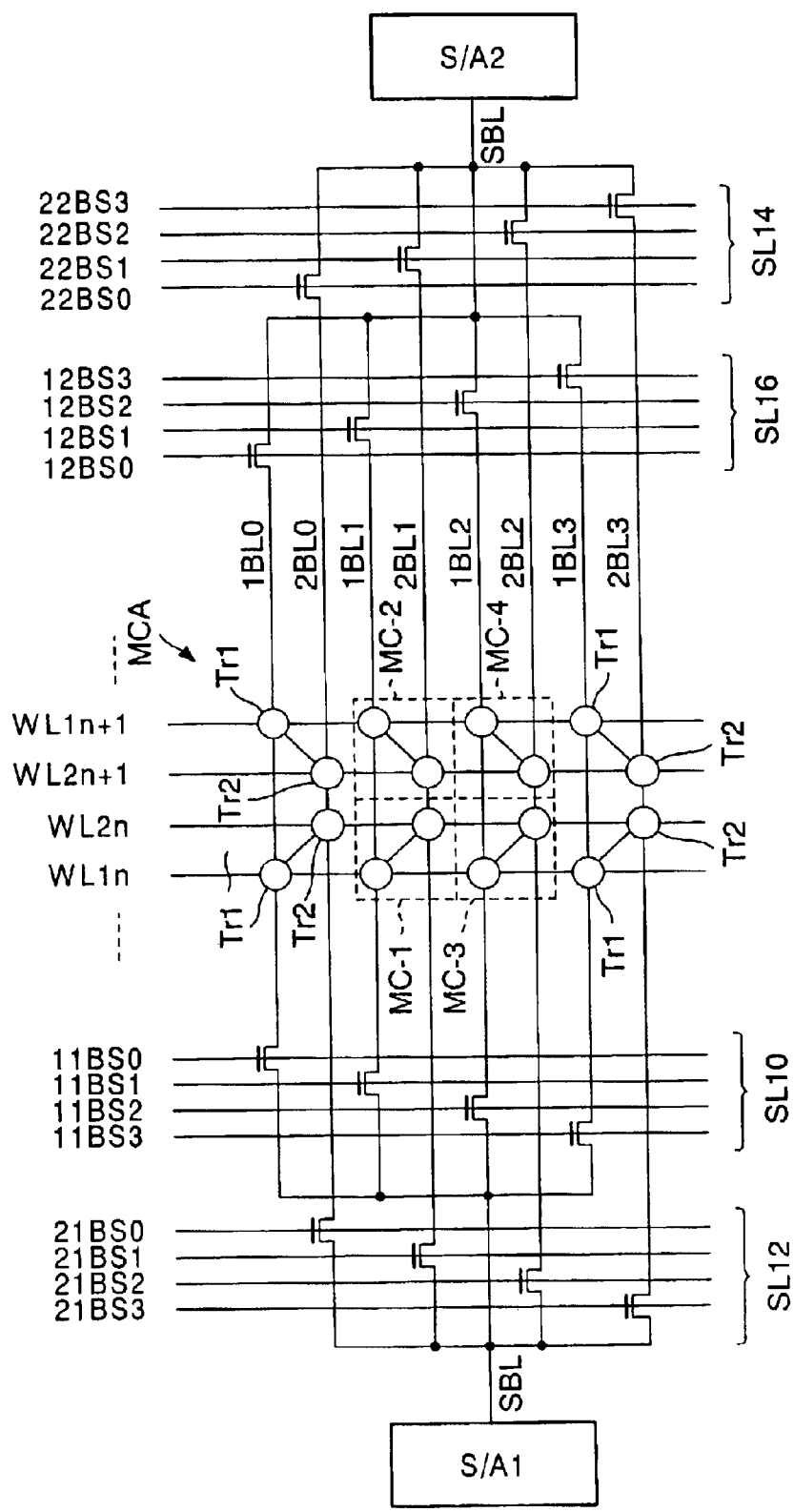
FIG. 17 is a diagram explaining the connection relationship of a memory cell array and the arrangement of sense amplifier circuits according to a second embodiment.

FIG. 17 is a diagram showing the configurations of the memory cell MCA in which the memory cells MC are arranged in a matrix form, the bit line selecting circuits SL10 to SL16 and the arrangement of sense amplifier circuits in a semiconductor memory device according to this embodiment, and corresponds to FIG. 5 described above.

The configuration of the memory cell array MCA according to this embodiment is basically the same as that in the aforementioned first embodiment, but functions of respective lines are different. Namely, first bit lines 1BL0 to 1BL3 and second bit lines 2BL0 to 2BL3 are alternately formed in parallel in the row direction of the memory cell array MCA. To be precise, drains of the MISFETs Tr1 arranged in the same row are connected to one of the first bit lines 1BL0 to 1BL3, and drains of the MISFETs Tr2 arranged in the same row are connected to one of the second bit lines 2BL0 to 2BL3.

Moreover, first word lines WL1n and second word lines WL2n are alternately formed in parallel in the column direction of the memory cell array MCA. To be precise, gates of the MISFETs Tr1 arranged in the same row are connected to one of the first word lines WL1n, and gates of the MISFETs Tr2 arranged in the same row are connected to one of the second word lines WL2n.

Incidentally, although eight memory cells MC are shown in the memory cell array MCA in FIG. 17, actually, more memory cells MC are arranged in the row and column directions. 256 first word lines WL1 and 256 second word lines WL2 are provided here. Namely, n=0 to 255.

The first bit line selecting circuit SL10 connects any one of the first bit lines 1BL0 to 1BL3 to a first sense amplifier circuit S/A1 based on selection signals of first selection signal lines 11BS0 to 11BS3. The second bit line selecting circuit SL12 connects any one of the second bit lines 2BL0 to 2BL3 to the first sense amplifier circuit S/Al based on selection signals of second selection signal lines 21BS0 to 21BS3.

The third bit line selecting circuit SL14 connects any of the second bit lines 2BL0 to 2BL3 to a second sense amplifier circuit S/A2 based on selection signals of third selection signal lines 22BS0 to 22BS3. The fourth bit line selecting circuit SL16 connects any of the first bit lines 1BL0 to 1BL3 to the second sense amplifier circuit S/A2 based on selection signals of fourth selection signal lines 12BS0 to 12BS3.

Figure 18:
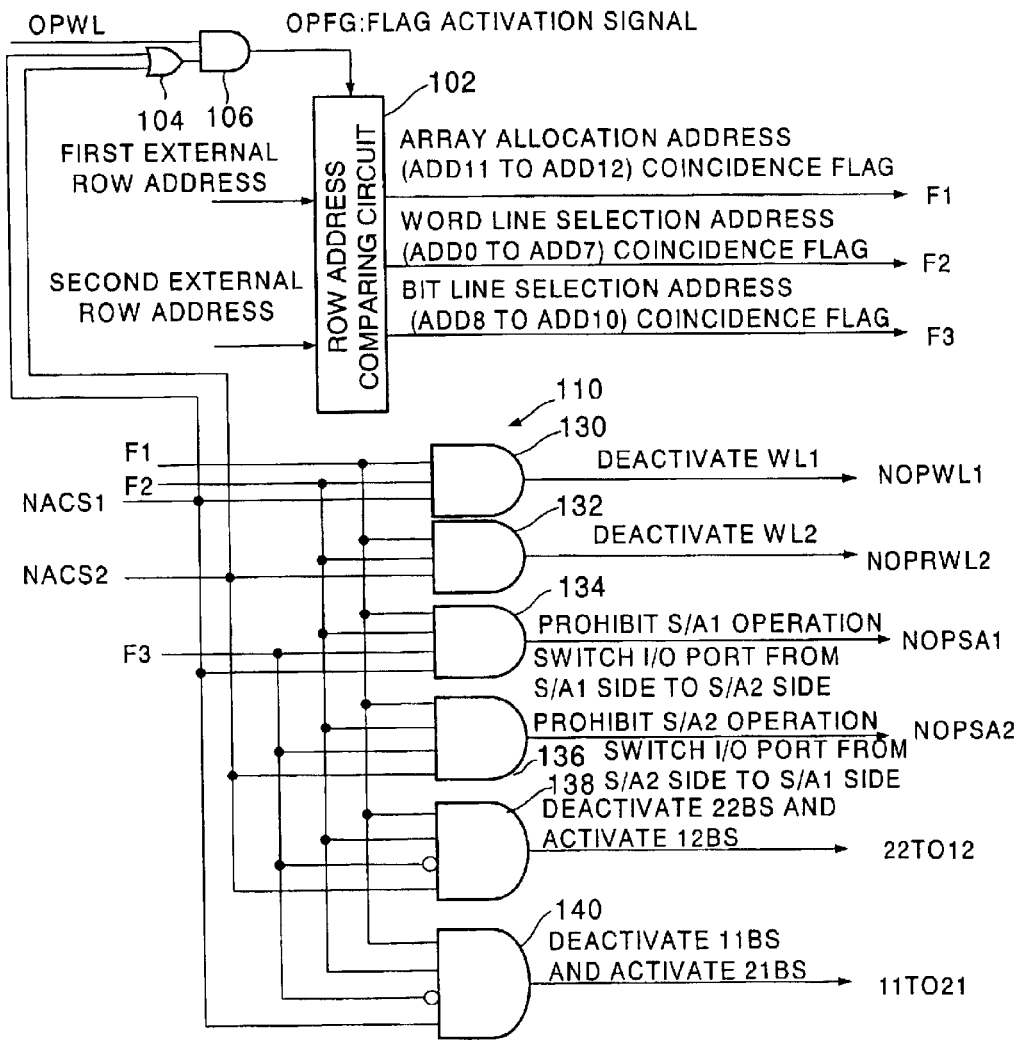
FIG. 18 is a diagram explaining input/output signals of a row address comparing circuit and the configuration of an array controller according to the second embodiment.
Figure 19:
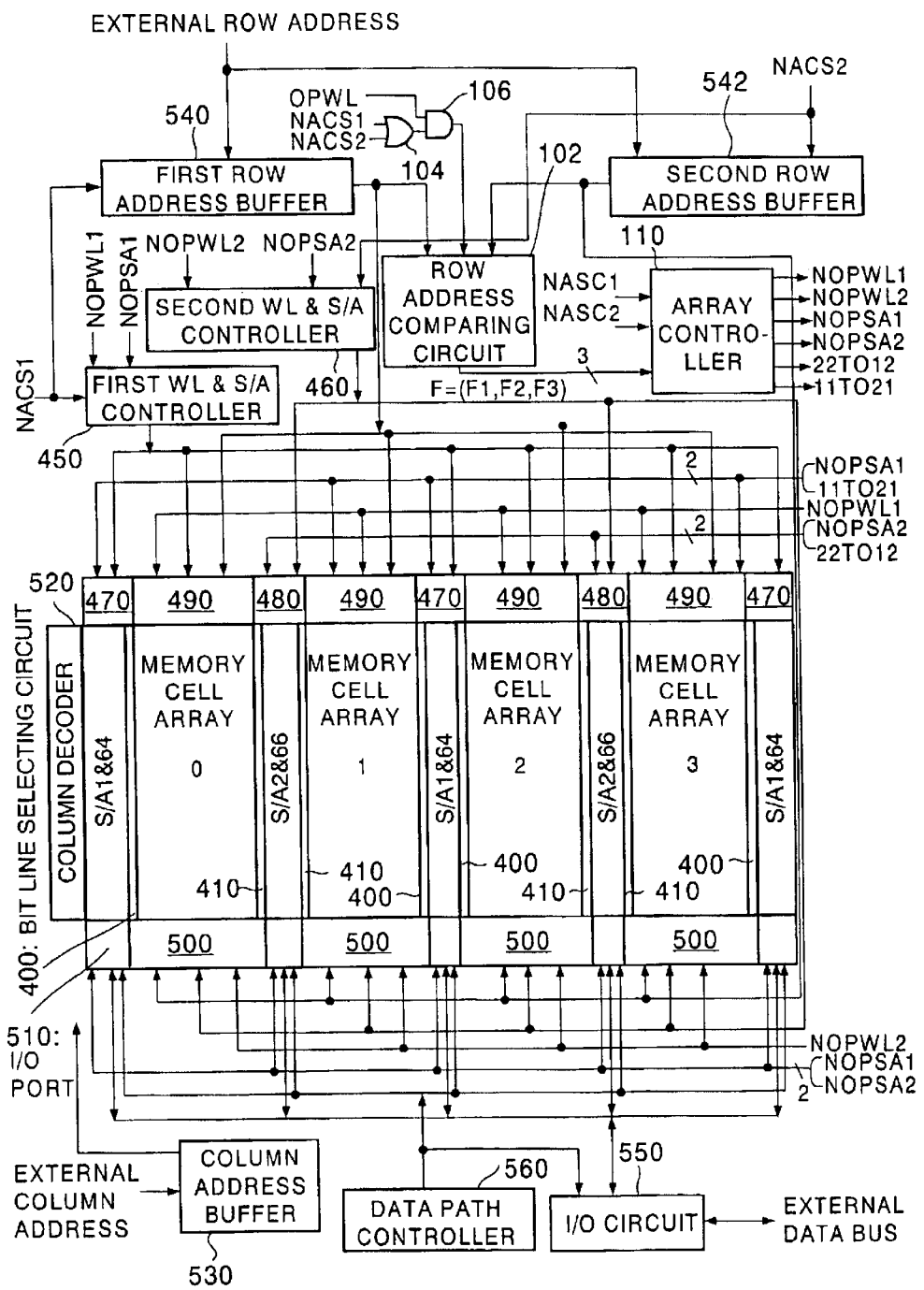
FIG. 19 is a circuit arrangement plan of a semiconductor memory device according to the second embodiment.

FIG. 18 is a diagram showing an operation determining logic circuit for executing operation which determines processing in the semiconductor memory device according to this embodiment, FIG. 19 is an arrangement plan of the semiconductor memory device into which the operation determining logic circuit in FIG. 18 is incorporated, and FIG. 18 and FIG. 19 correspond to FIG. 13 and FIG. 14 described above, respectively.

As shown in FIG. 18, the configuration of the operation determining logic circuit according to this embodiment is basically the same as that according to the aforementioned first embodiment, but the signals to be inputted are different and the roles of the output signals are also different. Namely, a first access control signal NACS1 and a second access control signal NACS2 are inputted to the OR circuit 104. The first access control signal NACS1 is a signal which goes high when a request for the normal operation in a first operation cycle is inputted. The second access control signal NACS2 is a signal which goes high when a request for the normal operation in a second operation cycle is inputted. An output of the OR circuit 104 is inputted to the AND circuit 106. The word line activation signal OPWL is also inputted to the AND circuit 106. This word line activation signal OPWL is a signal which goes high when the first word line WL1 or the second word line WL2 is activated. The flag activation signal OPFG which is an output of the AND circuit 106 is inputted to the row address comparing circuit 102. Namely, this flag activation signal OPFG is a signal which goes high when the first word line WL1 or the second word line WL2 is activated when the request for the normal operation is inputted in the first operation cycle or when the request for the normal operation is inputted in the second operation cycle. In other words, it is a signal which goes high when the normal operation in the first operation cycle and the normal operation in the second operation cycle overlap each other.

Here, the overall cycle time which consists of the first operation cycle and the second operation cycle is half the basic operation cycle time of this memory cell array MCA. In other words, the cycle time of the memory cell array MCA according to this embodiment is half the cycle time of the memory cell array MCA according to the aforementioned first embodiment. These first and second operation cycles alternately appear. Accordingly, the first half of the basic operation cycle is the first operation cycle, and the second half thereof is the second operation cycle.

Moreover, a first external row address designated by the normal operation in the first operation cycle from the outside and a second external row address designated by the normal operation in the second operation cycle from the outside are inputted to the row address comparing circuit 102. When the flag activation signal OPFG is high, the row address comparing circuit 102 compares the two external row addresses, drives the array allocation address coincidence flag F1 high when respective two bits of ADD11 and ADD12 coincide, drives the word line selection address coincidence flag F2 high when respective eight bits of ADD0 to ADD7 coincide, and drives the bit line selection address coincidence flag F3 high when respective three bits of ADD8 to ADD10 coincide.

These flags F1 to F3 are inputted to the array controller 110. The first access control signal NACS1 and the second access control signal NACS2 are also inputted to the array controller 110.

Further, the array controller 110 includes the AND circuits 130 to 140. The AND circuit 130 drives a control signal NOPWL1, which deactivates the first word line WL1, high when the array allocation addresses (flag F1=high) and the word line selection addresses (flag F2=high) respectively coincide and the first access control signal NACS1 goes high. Namely, since the word line selection addresses coincide, both the MISFET Tr1 and the MISFET Tr2 of one memory cell are activated if the first word line WL1 are activated, and hence to avoid this situation, the first word line WL1 is deactivated.

The AND circuit 132 drives a control signal NOPWL2, which deactivates the second word line WL2, high when the array allocation addresses (flag F1=high) and the word line selection addresses (flag F2=high) respectively coincide and the second access control signal NACS2 goes high. Namely, since the word line selection addresses coincide, both the MISFET Tr1 and the MISFET Tr2 of one memory cell are activated if the second word line WL2 is activated, and hence to avoid this situation, the second word line WL2 is deactivated.

The AND circuit 134 drives a control signal NOPSA1, which prohibits the operation of the first sense amplifier circuit S/A1 and switches the I/O port to the second sense amplifier circuit S/A2, high when the array allocation addresses (flag F1=high), the word line selection addresses (flag F2=high), and the bit line selection addresses (flag F3=high) respectively coincide and the first access control signal NACS1 goes high. Namely, since a request for the normal operation in the first operation cycle is made to the same memory cell MC that is accessed in the second operation cycle, even in the first operation cycle, the memory cell MC is accessed by the second sense amplifier circuit S/A2 being used in the second operation cycle.

The AND circuit 136 drives a control signal NOPSA2, which prohibits the operation of the second sense amplifier circuit S/A2 and switches the I/O port to the first sense amplifier circuit S/A1, high when the array allocation addresses (flag F1=high), the word line selection addresses (flag F2=high), and the bit line selection addresses (flag F3=high) respectively coincide and the second access control signal NACS2 goes high. Namely, since a request for the normal operation in the second operation cycle is made to the same memory cell MC that is accessed in the first operation cycle, even in the second operation cycle, the memory cell MC is accessed by the first sense amplifier circuit S/A1 being used in the first operation cycle.

The AND circuit 138 drives a control signal 22T012, which deactivates the third bit line selecting circuit SL14 and activates the fourth bit line selecting circuit SL16, high when the array allocation addresses (flag F1=high) and the word line selection addresses (flag F2=high) respectively coincide but the bit line selection addresses (flag F3=low) do not coincide and the second access control signal NACS2 goes high. Namely, this is a case where the memory cell MC which has the same word line selection address as the memory cell MC accessed in the first operation cycle but differs therefrom is accessed in the second operation cycle. In this case, one of the first bit lines is accessed by the second sense amplifier circuit S/A2 via the fourth bit line selecting circuit SL16.

The AND circuit 140 drives a control signal 11TO21, which deactivates the first bit line selecting circuit SL10 and activates the second bit line selecting circuit SL12, high when the array allocation addresses (flag F1=high) and the word line selection addresses (flag F2=high) respectively coincide but the bit line selection addresses (flag F3=low) do not coincide and the first access control signal NACS1 goes high. Namely, this is a case where the memory cell MC which has the same word line selection address as the memory cell MC accessed in the second operation cycle but differs therefrom is accessed in the first operation cycle. In this case, one of the second bit lines is accessed by the first sense amplifier circuit S/A1 via the second bit line selecting circuit SL12.

As shown in FIG. 19, the control signal NOPWL1 and the control signal NOPSAL out of the control signals outputted from the array controller 110 are inputted to a controller 450 for controlling the first word lines WL1 and the first sense amplifier circuits S/A1. The control signal NOPWL2 and the control signal NOPSA2 are inputted to a controller 460 for controlling the second word lines WL2 and the second sense amplifier circuits S/A2.

The control signal NOPSA1 and the control signal 11TO21 are inputted to drivers 470 for drive-controlling the first sense amplifier circuits S/A1 and bit line selecting circuits 400. The control signal NOPSA2 and the control signal 22TO12 are inputted to drivers 480 for drive-controlling the second sense amplifier circuits S/A2 and bit line selecting circuits 410. The control signal NOPWL1 is inputted to decoders and drivers 490 for the first word lines WL1. The control signal NOPWL2 is inputted to decoders and drivers 500 for the second word lines WL2. The control signal NOPSA1 and the control signal NOPSA2 are inputted to I/O ports 510.

Moreover, as shown in FIG. 19, the semiconductor memory device according to this embodiment includes four memory cell arrays 0 to 3. The memory cell arrays MCA adjacent to each other in the bit line direction share the first sense amplifier circuit S/A1 and the reference voltage generating circuit or share the second sense amplifier circuit S/A2 and the reference voltage generating circuit.

A column decoder 520 is provided on the left end side of these memory cell arrays, and an external column address inputted from the outside is inputted thereto via a column address buffer 530. On the other hand, an external row address inputted from the outside is inputted to a first row address buffer 540 or a second row address buffer 542. Namely, the external row address is inputted to the first row address buffer 540 in the first operation cycle, whereas the external row address is inputted to the second now address buffer 542 in the second operation cycle. In other words, the external address is inputted alternately to the first row address buffer 540 and the second row address buffer 542.

The row address is then inputted from the first row address buffer 540 to the aforementioned row address comparing circuit 102 and the decoders and drivers 490 for the first word lines WL1. Also, the row address is inputted from the second row address buffer 542 to the aforementioned row address comparing circuit 102 and the decoders and drivers 500 for the second word lines WL2.

Furthermore, data read from the memory cell arrays 0 to 3 and data to be written into the memory cell arrays 0 to 3 are sent to and received from an external data bus via an I/O circuit 550. The I/O circuit 550 and the I/O ports 510 are controlled by a data path controller 560.

Except for this point, the semiconductor memory device according to this embodiment is the same as the semiconductor memory device in the aforementioned first embodiment, and hence the explanation thereof is omitted.

As stated above, according to the semiconductor memory device according to this embodiment, the access time to the memory cell array MCA can be reduced to half of that in the basic operation cycle, whereby the speeding up of the semiconductor memory device can be realized. In addition, as shown in FIG. 16B mentioned above, the semiconductor memory device 272 according to this embodiment and a logic circuit 274 which operates using the semiconductor memory device 272 can be easily formed on a single semiconductor chip 270.

Figure 20:
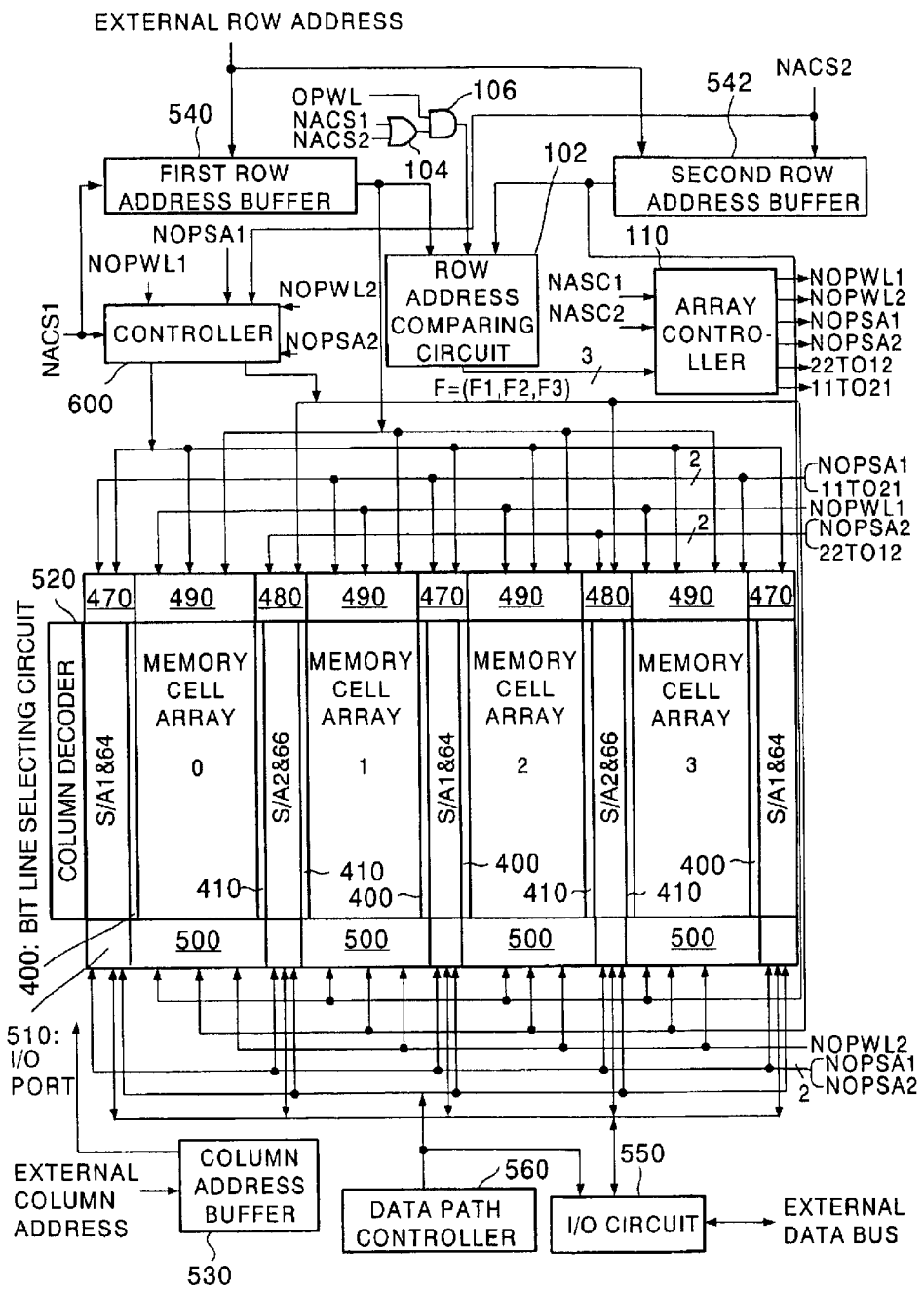
FIG. 20 is a circuit arrangement plan showing a modified example of the semiconductor memory device according to the second embodiment.
Figure 21:
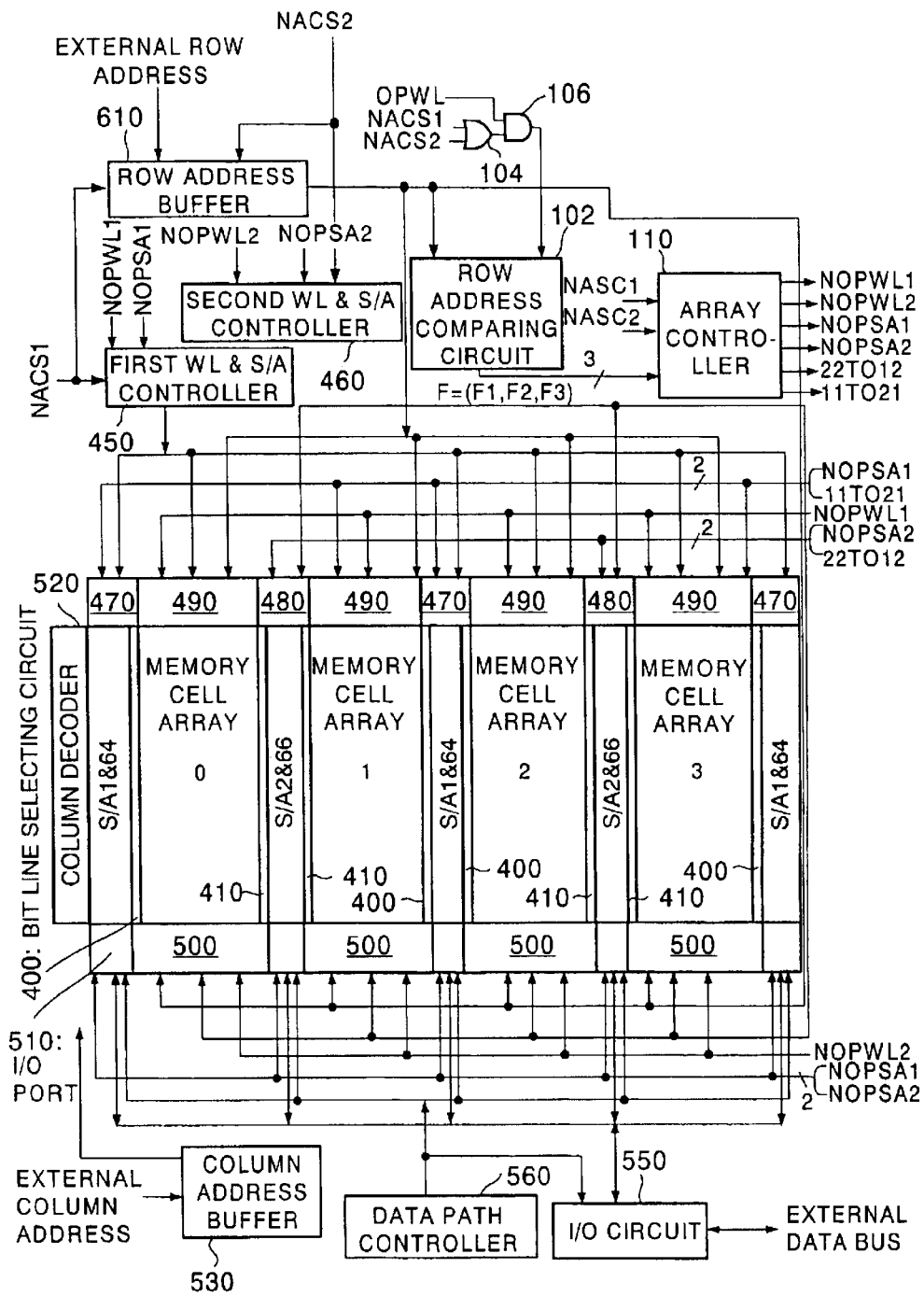
FIG. 21 is a circuit arrangement plan showing another modified example of the semiconductor memory device according to the second embodiment.
Figure 22:
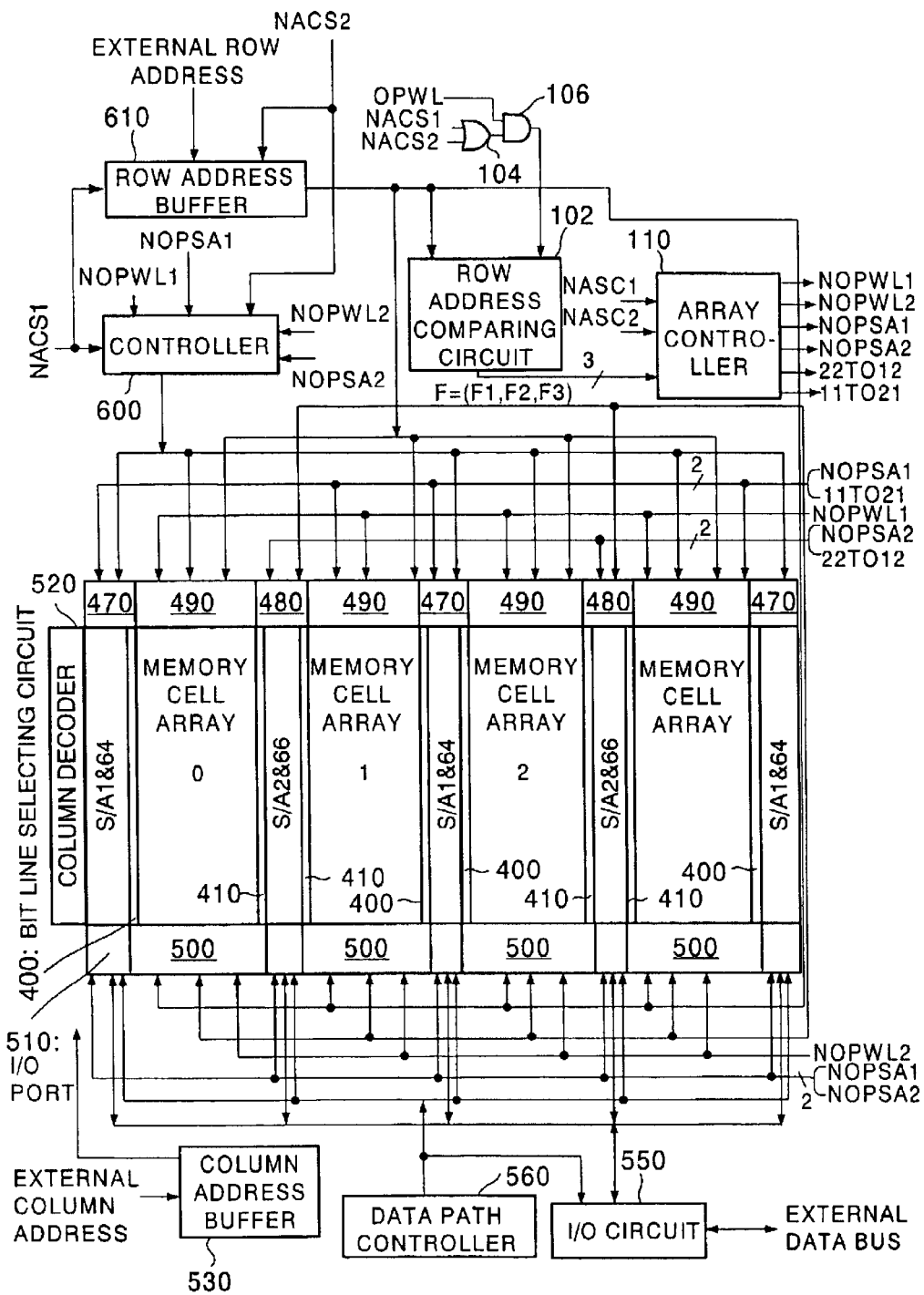
FIG. 22 is a circuit arrangement plan showing still another modified example of the semiconductor memory device according to the second embodiment.

It should be noted that the present invention is not limited to the aforementioned embodiments, and various modifications may be made therein. For example, it is possible that in the semiconductor memory device in FIG. 19, at least either two systems of the row address buffers 540 and 542 or two systems of the controllers 450 and 460 are unified as one system. More specifically, as shown in FIG. 20, the controller 450 and the controller 460 may be unified as one controller 600 which controls the first word lines WL1 and the second word lines WL2, and the first sense amplifier circuits SA/1 and the second sense amplifier circuits S/A2. Moreover, as shown in FIG. 21, the first row address buffer 540 and the second row address buffer 542 are unified as one row address buffer 610 into which the external row address is inputted in the fist operation cycle and the external row address is inputted in the second operation cycle. Furthermore, as shown in FIG. 22, it is also possible to unify the controller 450 and the controller 460 as one controller 600, and unify the first row address buffer 540 and the second row address buffer 542 as one row address buffer 610.

In these cases, it is necessary to operate the unified controller 600 and/or row address buffer 610 in half the time of the basic operation cycle of memory access. On the other hand, in FIG. 19, the row address buffers 540 and 542 and the controllers 450 and 460 can be operated in the actual basic operation cycle time of memory access.

Moreover, if such a semiconductor memory device is adopted, it becomes possible to select at user's discretion whether the refresh operation is concealed from the normal operation and used in an SRAM-like interface or the refresh operation is used in a DRAM interface and the cycle time is reduced to half. A selection between the above two systems differs from one user to another, and therefore if circuit configurations of both the systems are previously prepared for the semiconductor memory device and designed to be selectable by mask option, bonding option, or a general programmable circuit, both the systems can be selected with great facility. Moreover, an increase in chip area produced in this case is very small since they are not in a memory cell portion.

Furthermore, in the aforementioned embodiments, as shown in FIG. 6, two reference cells RC0 and RC1 are provided for a pair of the normal word line NWL and the refresh word line RWL. Namely, the reference voltage generating circuits 64 and 66 are respectively designed to acquire the reference current Icell0+Icell1 by using one reference cell RC0 holding the "0" data and one reference cell RC1 holding the "1" data. However, the number of reference cells provided for the pair of the normal word line NWL and the refresh word line RWL is not limited to two, and it has only to be 2N (N is a natural number). In this case, 2N pairs (namely, 2N×2) of the reference bit lines RNBL and RRBL need to be provided.

When the number of reference cells is 2N, it is recommended to hold the following relation in the first sense amplifier SA1 and the second sense amplifier SA2 shown in FIG. 10. Specifically, when the reference current is multiplied by P by the current mirror circuit including the MISFET TR31 and the MISFET TR32, and the read cell current is multiplied by Q by the current mirror circuit including the MISFET TR11 and the MISFET TR12, such setting as satisfies the relation of P/Q=1/(2N) is required, where P and Q are respectively any given positive numbers.

What is claimed is:

1. A semiconductor memory device including a memory cell array having a plurality of memory cells, each of the memory cells comprising:

a first MISFET including a first source region formed in a semiconductor layer, a first drain region which is formed in the semiconductor layer and which is apart from the first source region, and a first gate electrode formed on the semiconductor layer between the first source region and the first drain region, wherein the semiconductor layer between the first source region and the first drain region is a floating body in a floating state; and a second MISFET including a second source region formed in the semiconductor layer, a second drain region which is formed in the semiconductor layer and which is apart from the second source region, and a second gate electrode formed on the semiconductor layer between the second source region and the second drain region, wherein the semiconductor layer between the second source region and the second drain region is the floating body shared with the first MISFET.

2. The semiconductor memory device as set forth in claim 1, wherein the memory cells are formed on an SOI (silicon on insulator) substrate.

3. The semiconductor memory device as set forth in claim 1, further comprising:

a plurality of first word lines which are connected to the first gate electrodes of the first MISFETs;

a plurality of second word lines which are connected to the second gate electrodes of the second MISFETs;

a plurality of first bit lines which are connected to the first drain regions of the first MISFETs; and a plurality of second bit lines which are connected to the second drain regions of the second MISFETs.

4. The semiconductor memory device as set forth in claim 3, further comprising:

a first bit line selecting circuit which is provided on one side of a bit line direction of the memory cell array and which selects a first selected bit line out of the first bit lines and the second bit lines;

a first sense amplifier circuit which senses data of a selected memory cell among the memory cells via the first selected bit line selected by the first bit line selecting circuit;

a second bit line selecting circuit which is provided on the other side of the bit line direction of the memory cell array and which selects a second selected bit line out of the first bit lines and the second bit lines; and a second sense amplifier circuit which senses data of a selected memory cell among the memory cells via the second selected bit line selected by the second bit line selecting circuit.

5. The semiconductor memory device as set forth in claim 4, further comprising:

a first word line driver which is provided on one side of a word line direction of the memory cell array and which drives the first word lines; and a second word line driver which is provided on the other side of the word line direction of the memory cell array and which drives the second word lines.

6. The semiconductor memory device as set forth in claim 3, further comprising:

a first sense amplifier circuit which is provided on one side of a bit line direction of the memory cell array and which senses data of a selected memory cell among the memory cells; and a second sense amplifier circuit which is provided on the other side of the bit line direction of the memory cell array and which senses data of a selected memory cell among the memory cells.

7. The semiconductor memory device as set forth in claim 6, further comprising:

a row address comparing circuit which compares an external row address with an internal row address, wherein the external row address is an address for a normal operation which is a read operation or a write operation to the memory cells, and the internal row address is an address for a refresh operation to the memory cells; and a control circuit which controls access to the memory cell array in the normal operation and the refresh operation in accordance with a comparison result of the row address comparing circuit.

8. The semiconductor memory device as set forth in claim 7, wherein, when the comparison result of the row address comparing circuit indicates that a word line selection address of the external row address is different from a word line selection address of the internal row address even if the normal operation and the refresh operation are concurrent, the control circuit controls the memory cell array so that the normal operation is performed by using the first sense amplifier circuit, the first word line and the first bit line, and the refresh operation is performed by using the second sense amplifier circuit, the second word line and the second bit line.

9. The semiconductor memory device as set forth in claim 8, wherein, when the comparison result of the row address comparing circuit indicates that a word line selection address of the external row address coincides with a word line selection address of the internal row address but a bit line selection address of the external row address is different from a bit line selection address of the internal row address even if the normal operation and the refresh operation are concurrent, the control circuit controls the memory cell array so that the refresh operation is performed by using the second sense amplifier circuit, the first word line and the first bit line, if the refresh operation is requested when the first sense amplifier circuit is being used in the normal operation, and the control circuit controls the memory cell array so that the normal operation is performed by using the first sense amplifier circuit, the second word line and the second bit line, if the normal operation is requested when the second sense amplifier circuit is being used in the refresh operation.

10. The semiconductor memory device as set forth in claim 9, wherein, when the comparison result of the row address comparing circuit indicates that a word line selection address of the external row address coincides with a word line selection address of the internal row address and a bit line selection address of the external row address coincides with a bit line selection address of the internal row address even if the normal operation and the refresh operation are concurrent, the control circuit controls the memory cell array so that the refresh operation is not performed if the refresh operation is requested when the first sense amplifier circuit is being used in the normal operation, and the control circuit controls the memory cell array so that the normal operation is performed by using the second sense amplifier circuit, the second word line and the second bit line, if the normal operation is requested when the second sense amplifier circuit is being used in the refresh operation.

11. The semiconductor memory device as set forth in claim 6, further comprising:

a row address comparing circuit which compares a first external row address with a second external row address, wherein the first external row address is an address for a normal operation which is a read operation or a write operation to the memory cells in a first operation cycle, and the second external row address is an address for the normal operation to the memory cells in a second operation cycle; and a control circuit which controls access to the memory cell array in the normal operation in the first operation cycle and the second operation cycle in accordance with a comparison result of the row address comparing circuit.

12. The semiconductor memory device as set forth in claim 11, wherein, when the comparison result of the row address comparing circuit indicates that a word line selection address of the first external row address is different from a word line selection address of the second external row address even if the normal operation in the first operation cycle and the normal operation in the second operation cycle are concurrent, the control circuit controls the memory cell array so that the normal operation in the first operation cycle is performed by using the first sense amplifier circuit, the first word line and the first bit line, and the normal operation in the second operation cycle is performed by using the second sense amplifier circuit, the second word line and the second bit line.

13. The semiconductor memory device as set forth in claim 12, wherein, when the comparison result of the row address comparing circuit indicates that a word line selection address of the first external row address coincides with a word line selection address of the second external row address but a bit line selection address of the first external row address is different from a bit line selection address of the second external row address even if the normal operation in the first operation cycle and the normal operation in the second operation cycle are concurrent, the control circuit controls the memory cell array so that the normal operation in the second operation cycle is performed by using the second sense amplifier circuit, the first word line and the first bit line, if the normal operation in the second cycle is requested when the first sense amplifier circuit is being used in the normal operation in the first operation cycle, and the control circuit controls the memory cell array so that the normal operation in the first operation cycle is performed by using the first sense amplifier circuit, the second word line and the second bit line, if the normal operation in the first operation cycle is requested when the second sense amplifier circuit is being used in the normal operation in the second operation cycle.

14. The semiconductor memory device as set forth in claim 13, wherein, when the comparison result of the row address comparing circuit indicates that a word line selection address of the first external row address coincides with a word line selection address of the second external row address and a bit line selection address of the first external row address coincides with a bit line selection address of the second external row address even if the normal operation in the first operation cycle and the normal operation in the second cycle are concurrent, the control circuit controls the memory cell array so that the normal operation in the second operation cycle is performed by using the first sense amplifier circuit, the first word line and the first bit line, if the normal operation in the second cycle is requested when the first sense amplifier circuit is being used in the normal operation in the first operation cycle, and the control circuit controls the memory cell array so that the normal operation in the first operation cycle is performed by using the second sense amplifier circuit, the second word line and the second bit line, if the normal operation in the first operation cycle is requested when the second sense amplifier circuit is being used in the normal operation in the second operation cycle.

15. The semiconductor memory device as set forth in claim 6, further comprising a reference voltage generating circuit which acquires a reference current by using a first reference cell in which "0" data is to be stored and a second reference cell in which "1" data is to be stored in order to generate a reference voltage in accordance with the reference current, wherein the first sense amplifier circuit and the second sense amplifier circuit determine the data stored in the selected memory cell in accordance with the reference voltage generated in the reference voltage generating circuit.

16. The semiconductor memory device as set forth in claim 15, further comprising:

a first reference word line provided along the word line direction; and a second reference word line provided along the word line direction, wherein the first reference cell is also provided at intersection point of the first and the second reference word lines and a pair of the first reference bit lines, and the second reference cell is also provided at intersection point of the first and the second reference word lines and a pair of the second reference bit lines.

17. The semiconductor memory device as set forth in claim 15, further comprising:

at least one pair of first reference bit lines provided along the bit line direction; and at least one pair of second reference bit lines provided along the bit line direction, wherein structures of the first reference cells are the same as structures of the memory cells and the first reference cells are provided at intersection points of the first reference bit lines and the first and second word lines, structures of the second reference cells are the same as structures of the memory cells and the second reference cells are provided at intersection points of the second reference bit lines and the first and second word lines, and the reference voltage generating circuit acquires the reference current by using at least one of the first reference cells and at least one of the second reference cells activated by one of the first word lines or one of the second word lines.

18. The semiconductor memory device as set forth in claim 17, wherein the first gate electrode of each of the first reference cells is connected to one of the first word lines, the second gate electrode of each of the first reference cells is connected to one of the second word lines, the first drain region of each of the first reference cells is connected to one of the pair of the first reference bit lines, the second drain region of each of the first reference cells is connected to the other of the pair of the first reference bit lines, the first gate electrode of each of the second reference cells is connected to one of the first word lines, the second gate electrode of each of the second reference cells is connected to one of the second word lines, the first drain region of each of the second reference cells is connected to one of the pair of the second reference bit lines, and the second drain region of each of the second reference cells is connected to the other of the pair of the second reference bit lines.

19. The semiconductor memory device as set forth in claim 18, wherein the first and second sense amplifier circuits determine the data stored in the selected memory cell by using a current obtained by multiplying the reference current by P and a current obtained by multiplying a cell current flowing through the selected memory cell by Q, where P and Q are respectively any given positive numbers.

20. The semiconductor memory device as set forth in claim 19, wherein the number of the first reference cells and the number of the second reference cells, which are used when the reference voltage generating circuit acquires the reference current, are respectively N, where N is a natural number, and P/Q is ½N.

21. A semiconductor device comprising:

a semiconductor memory which is formed on a semiconductor chip; and a logic circuit which is formed on the semiconductor chip and which operates using the semiconductor memory cell, wherein the semiconductor memory includes a memory cell array having a plurality of memory cells, each of the memory cells comprising:

a first MISFET including a first source region formed in a semiconductor layer, a first drain region which is formed in the semiconductor layer and which is apart from the first source region, and a first gate electrode formed on the semiconductor layer between the first source region and the first drain region, wherein the semiconductor layer between the first source region and the first drain region is a floating body in a floating state; and a second MISFET including a second source region formed in the semiconductor layer, a second drain region which is formed in the semiconductor layer and which is apart from the second source region, and a second gate electrode formed on the semiconductor layer between the second source region and the second drain region, wherein the semiconductor layer between the second source region and the second drain region is the floating body shared with the first MISFET.

* * * * *